(12) United States Patent
Castro et al.

(10) Patent No.: US 10,410,721 B2
(45) Date of Patent: Sep. 10, 2019

(54) PULSED INTEGRATOR AND MEMORY TECHNIQUES

(71) Applicant: Micron Technology, Inc., Boise, ID (US)

(72) Inventors: Hernan A. Castro, Shingle Springs, CA (US); Jeremy M. Hirst, Orangevale, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/821,240

(22) Filed: Nov. 22, 2017

(65) Prior Publication Data

US 2019/0156887 A1 May 23, 2019

(51) Int. Cl.
*G11C 13/00* (2006.01)
*G11C 11/22* (2006.01)
*G11C 11/00* (2006.01)
*G11C 11/56* (2006.01)

(52) U.S. Cl.
CPC ........ *G11C 13/0061* (2013.01); *G11C 13/004* (2013.01); *G11C 11/00* (2013.01); *G11C 11/22* (2013.01); *G11C 11/221* (2013.01); *G11C 11/223* (2013.01); *G11C 11/5657* (2013.01); *G11C 2013/0054* (2013.01)

(58) Field of Classification Search
CPC .............. G11C 13/0061; G11C 13/004; G11C 2013/0054; G11C 11/00; G11C 11/22; G11C 11/221223; G11C 11/5657; H01L 27/11502; H01L 27/11585; H01L 2924/1441
See application file for complete search history.

(56) References Cited

U.S. PATENT DOCUMENTS

| | | | | |
|---|---|---|---|---|
| 4,873,408 | A | * | 10/1989 | Smith .................... H05B 6/666 219/716 |
| 2011/0069059 | A1 | * | 3/2011 | Lee ........................... G05F 1/56 345/212 |
| 2015/0028887 | A1 | * | 1/2015 | Hanssen .............. G01R 21/006 324/601 |
| 2015/0078075 | A1 | * | 3/2015 | Franklin ............ G11C 13/0069 365/163 |

OTHER PUBLICATIONS

U.S. Appl. No. 15/619,158, filed Jun. 9, 2017.

* cited by examiner

*Primary Examiner* — Harry W Byrne
*Assistant Examiner* — Sultana Begum
(74) *Attorney, Agent, or Firm* — Holland & Hart LLP

(57) ABSTRACT

Methods, systems, and devices for a pulsed integrator and memory techniques are described. A first device may facilitate discharging a memory cell using at least one current pulse until a voltage associated with the memory cell reaches a reference voltage. The discharge time of the memory cell may be determined based at least in part on a duration of at least one current pulse. In some examples, a state of the memory cell may be determined based at least in part on a discharge time.

13 Claims, 14 Drawing Sheets

PULSED INTEGRATOR AND MEMORY TECHNIQUES

BACKGROUND

The following relates generally to operating a memory array and more specifically to a pulsed integrator and memory techniques.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory devices, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices. Improving memory devices, generally, may include increasing memory cell density, increasing read/write speeds, increasing reliability, increasing data retention, reducing power consumption, or reducing manufacturing costs, among other metrics.

Some memory devices may determine a state of a memory cell based on an amount of stored charge within the memory cell. Some such memory devices may utilize a sensing scheme to determine the amount of stored charge.

DETAILED DESCRIPTION

Figure 1:
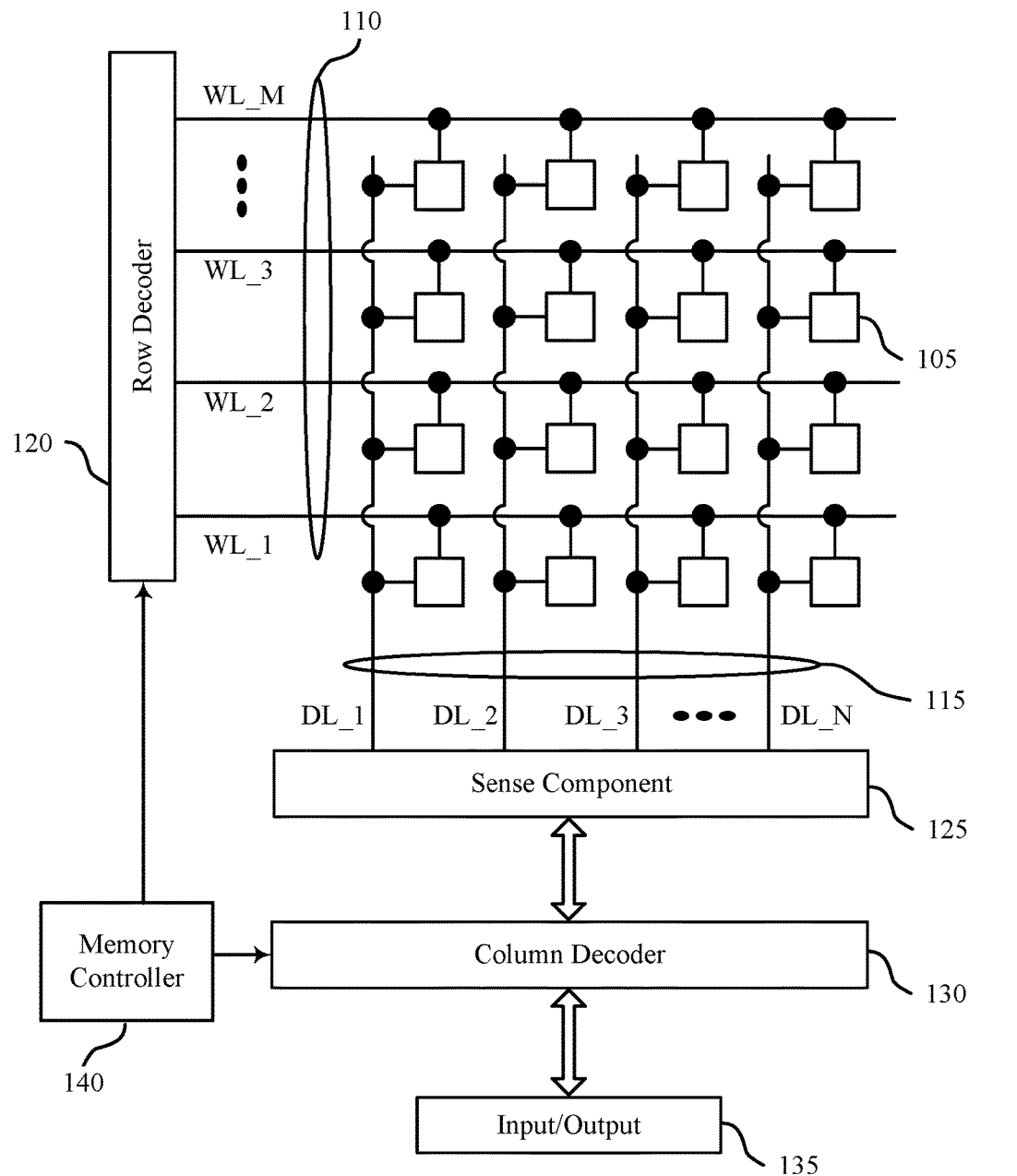
FIG. 1 illustrates an example of a memory array that supports a pulsed integrator and memory techniques in accordance with embodiments of the present disclosure.

Some memory devices may determine a state of a memory cell based on an amount of stored charge within the memory cell. Some such memory devices may utilize a voltage sensing scheme to determine the amount of stored charge. For example, a voltage at a first node (e.g., a node coupled with the memory cell, or a node coupled with a capacitor to which charge within the memory cell may be transferred) may be compared to a reference voltage, and a state of the memory cell may be determined based on whether the sensed voltage is greater than or less than the reference voltage. As a further example, as part of a voltage sensing scheme for an FeRAM memory cell, a voltage may be applied to the memory cell, and a resulting voltage at a node (e.g., a sense node) may be compared to a reference voltage, as the resulting voltage at the sense node may depend in part on the amount of charge that was stored within the memory cell before application of the voltage.

Some voltage sensing schemes may not account, however, for all charge stored within a memory cell. For example, if charge is extracted from the memory cell over some duration, a voltage sensing scheme may not properly account for all the extracted charge (e.g., due to leakage during the extraction period). Also, because a voltage sensing scheme may require application of a voltage to the memory cell in order to fully extract all charge stored in the memory cell, partial rather than full extraction may occur, and/or the sensed voltage may be influenced by the applied voltage (e.g., may depend on the magnitude of the applied voltage or how long the applied voltage has been applied, among other factors). These and other shortcomings of voltage sensing schemes may corrupt the sensing operations of the device or lead to other shortcomings, resulting in inaccurate reads and decreased performance. Further, these and other shortcomings of voltage sensing schemes may be common across types of memory devices even if more pronounced for some types of memory devices (e.g., FeRAM devices) than others. Systems and methods for accurately sensing an amount of charged stored in a memory cell are desired.

In some cases, an integrator (e.g., a charge integrator) may be included in a memory array to sense an amount of charge stored in one or more memory cells within the memory array. As described herein, an integrator may determine an amount of charge stored in a memory cell based at least in part on (i) an amount of time required to discharge the memory cell until a sensed voltage reaches a reference voltage, which may be referred to as a discharge time in some cases, and (ii) a magnitude of the current via which discharge occurs, which may be referred to as a discharge current level in some cases. The discharge time may be measured, and a state of the memory cell may be determined based at least in part on the discharge time (e.g., different discharge times may correspond to different amounts of stored charge and thus to different states of the memory cell).

The discharge current level may be configured to a known current level, and the amount of stored charge extracted from the memory cell may thus be determined based at least in part on the integral of the known current level over the discharge time, among other techniques. As merely one example, if the discharge current level is a known current level, the amount of stored charge extracted from the memory cell may be determined based at least in part on multiplying the known current level by the discharge time.

In some cases, discharge may occur via a current sink for which a current level is known. For example, the related memory components may be configured so that discharge may occur via a current mirror having a known and fixed current level. The current sink may be selectively coupled with the memory cell via a switch (e.g., one or more transistors) such that whenever the switch is closed (as one example), discharge occurs at the known current level of the current sink, and whenever the switch is open (as one example), no discharge occurs. The switching component may be controlled via a feedback component, which may be configured to activate the current sink (e.g., close the switch so that discharge occurs) via a unidirectional feedback path when a voltage associated with the memory cell (which may be referred to as a sensed voltage) is greater than a reference voltage. The feedback component may comprise or be coupled with a sense amplifier, which may be a differential amplifier (e.g., a comparator) or a non-differential amplifier, configured to amplify the sensed voltage.

In some examples, the feedback component may be configured to activate the current sink (e.g., continuously) until the sensed voltage reaches a reference voltage level. That is, the feedback component may be configured to close the switch in order to discharge the memory cell through the current sink until the sensed voltage reaches the reference voltage level. In such examples, discharge thus occurs via a single pulse of discharge current at the known current level of the current sink, and an amount of extracted charge may be determined based at least in part on the measured duration of the single pulse and the known current level of the current sink. In some such examples, the discharge time may be determined based at least in part on a clock signal having a known frequency (e.g., a counting circuit may be configured to count how many periods or half-periods of the clock signal occur while the current sink is active).

In some cases, the discharge current level may be a fixed constant value throughout the single pulse, so the number of periods or half-periods of the clock signal that are counted during the single pulse may serve as an indicator (e.g. a proxy) for discharge time, with the memory cell determined to be in a given state based on how the counted number of periods or half-periods of the clock signal compares to one or more thresholds (e.g., the memory cell may be determined to be in a first state if the counted number is greater than or equal to a threshold number and may be determined to be in a second state if the counted number is less than the threshold number).

In other examples, the feedback component may be configured to activate the current sink (e.g., intermittently) until the sensed voltage reaches the reference voltage level. That is, the feedback component may be configured to open and close the switch between the memory cell and the current sink (e.g., repeatedly, periodically, aperiodically) until the sensed voltage reaches the reference voltage level, with discharge occurring at the known current level of the current sink only when the switch is closed. In such examples, discharge thus occurs via multiple pulses of discharge current, each pulse at the known current level of the current sink, and an amount of extracted charge may be determined based at least in part on the collective duration of the multiple pulses and the known current level of the current sink. Each of the multiple pulses of discharge current may be configured to have a known, fixed duration, and discharge time may be determined based at least in part on a pulse count.

In some examples, each of the multiple pulses of discharge current may occur at regular, fixed intervals (e.g., the feedback component may be configured to active the current sink via a control signal that is a aligned to a clock signal), and in other examples, the multiple pulses of discharge current may occur at irregular, variable intervals (e.g., the feedback component may be configured to activate the current sink via an internally-generated control signal that is not aligned to a clock signal). In some such examples, the discharge time may be determined based at least in part how many discharge current pulses occur until the sensed voltage reaches the reference voltage level (e.g., a counting circuit or a counter may be configured to facilitate tracking pulses of the switch control signal output by the feedback component, among other techniques). In some cases, the discharge current level may be a same fixed value during each pulse, and each pulse may have a same fixed duration, so the number of counted current pulses (or equivalently the number of control signal pulses) may serve as an indicator of (e.g., a proxy) for discharge time, with the memory cell determined to be in a given state based on how the counted number of pulses compares to one or more thresholds (e.g., the memory cell may be determined to be in a first state if the counted number of pulses is greater than or equal to a threshold number and determined to be in a second state if the counted number of pulses is less than the threshold number).

Thus, rather than determining the amount of stored charge based on a voltage measurement, an amount of stored charge within a memory cell may be determined based on a time measurement, with discharge current integrated over the time measurement. Beneficially, an integrator as described herein may measure an amount of charge that is extracted from the memory cell over time or otherwise sense the amount of charge that is extracted from the memory cell (e.g., provide a corresponding discharge time measurement) with improved accuracy compared to a voltage sensing scheme. An integrator, in accordance with some embodiments described herein, may also measure or otherwise sense an amount of charge that is extracted from the memory cell in the presence of a voltage applied to the memory cell (e.g., a constant applied voltage) with improved accuracy compared to a voltage sensing scheme. An integrator, in accordance with some embodiments described herein, may also occupy a small area and operate at a high speed and thus may be included in high density memory arrays, such as three-dimensional cross-point memory arrays, FeRAM memory arrays, or RRAM memory arrays. Further, an integrator as described herein may allow a memory cell subjected to a read operation to be fully driven by an applied voltage while measuring or otherwise sensing the extracted charge, which may improve the accuracy of read operations and the efficiency of write back operations.

In some cases, an integrator, in accordance with some embodiments described herein, may improve the compensation of a reference voltage level for the sense amplifier. For example, an integrator may improve immunity to leakage from other memory cells in a memory array, to leakage from row or column decoder structures in the memory array, and to variations in transistor characteristics. Further, the design of the integrator may be configured to be compatible with various two terminal memory selection components such as non-snapback diode-like selection components and snapback selection components, as well as three terminal selection components such as think film transistors and bipolar transistors. In some cases, including an integrator as described herein in a memory array may be used to measure stored charge amounts from a plurality of memory cells within the memory array. In some examples, an integrator as described herein may be used to detect one or more levels of charge from the same memory cell.

Features of the disclosure introduced above are further described below in the context of FIG. 1. Examples are then described with reference to FIGS. 2-14. These and other features of the disclosure are further illustrated by and described with reference to apparatus diagrams, system diagrams, and flowcharts that relate to a pulsed integrator and memory techniques. Although some embodiments are described in the context of a pulsed integrator, other embodiments and implementation are contemplated, and the present disclosure is not limited to embodiments or implementations related to a pulsed integrator.

FIG. 1 illustrates an example memory array 100 in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some cases, memory cell 105 is configured to store more than two logic states. A memory cell 105 may store a charge representative of the programmable states in a capacitor; for example, a charged and uncharged capacitor may represent two logic states, respectively. DRAM architectures may commonly use such a design, and the capacitor employed may include a dielectric material with linear or para-electric electric polarization properties as the insulator. By contrast, a ferroelectric memory cell may include a capacitor with a ferroelectric as the insulating material. Different levels of charge of a ferroelectric capacitor may represent different logic states. Ferroelectric materials have non-linear polarization properties; some details and advantages of a ferroelectric memory cell 105 are discussed below.

Operations such as reading and writing may be performed on memory cells 105 by activating or selecting access line 110 and digit line 115. Access lines 110 may also be known as word lines 110, and bit lines 115 may also be known digit lines 115. In some embodiments, plate lines (not shown) may be present. References to word lines and bit lines, or their analogues, are interchangeable without loss of understanding or operation. In some cases, either word lines 110, bit lines 115, or plate lines may also be referred to as select lines. Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), etc.), metal alloys, carbon, conductively-doped semiconductors, or other conductive materials, alloys, compounds, or the like.

According to the example of FIG. 1, each row of memory cells 105 is connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105.

Memory array 100 may be a two-dimensional (2D) memory array or a three-dimensional (3D) memory array. A 3D memory array may include two-dimensional (2D) memory arrays formed on top of one another. This may increase the number of memory cells that may be placed or created on a single die or substrate as compared with 2D arrays, which in turn may reduce production costs or increase the performance of the memory array, or both. Memory array 100 may include any number of levels. Each level may be aligned or positioned so that memory cells 105 may be approximately aligned with one another across each level.

In the example depicted in FIG. 1, memory array 100 includes one level of memory cells 105 and may thus be considered a two-dimensional memory array; however, the number of levels is not limited. Additionally, for example, in a 3D memory array, each level in a row may have common conductive lines such that each level may share word lines 110 or digit lines 115 or contain separate word lines 110 or digit lines 115. Thus in a 3D configuration one word line 110 and one digit line 115 of a same level may be activated to access a single memory cell 105 at their intersection. The intersection of a word line 110 and digit line 115, in either a 2D or 3D configuration, may be referred to as an address of a memory cell.

In some architectures, the logic storing device of a cell, e.g., a capacitor, may be electrically isolated from the digit line 115 by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed.

Upon accessing, a memory cell 105 may be read, or sensed, by sense component 125 to determine the stored state of the memory cell 105. In some cases, sense component 125 may include one or more pulsed integrators as described herein. In some cases, the state of a memory cell 105 may be determined based at least in part on an amount of time and an amount of current required to discharge memory cell 105 until a sensed voltage reaches a reference voltage. In some cases, the state of memory cell 105 may be determined based at least in part by comparing a clock period count (e.g., a period count or a half-period count) or a pulse count to a reference count.

The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120.

A memory cell 105 may be set, or written, by similarly activating the relevant word line 110 and digit line 115—i.e., a logic value may be stored in the memory cell 105. Column decoder 130 or row decoder 120 may accept data, for example input/output 135, to be written to the memory cells 105. A ferroelectric memory cell 105 may be written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, ferroelectric memory cells 105 may have beneficial properties that may result in improved performance relative to other memory architectures.

The memory controller 140 may control the operation (e.g., read, write, re-write, refresh, discharge, etc.) of memory cells 105 through the various components, for example, row decoder 120, column decoder 130, and sense component 125. For example, memory controller 140 may control the operation one or more pulsed integrators as described herein. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory array 100. For example, it may apply discharge voltages to a word line 110 or digit line 115 after accessing one or more memory cells 105. In general, the amplitude, shape, or duration of an applied voltage or current discussed herein may be adjusted or varied and may be different for the various operations discussed in operating memory array 100. Further, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

Figure 2:
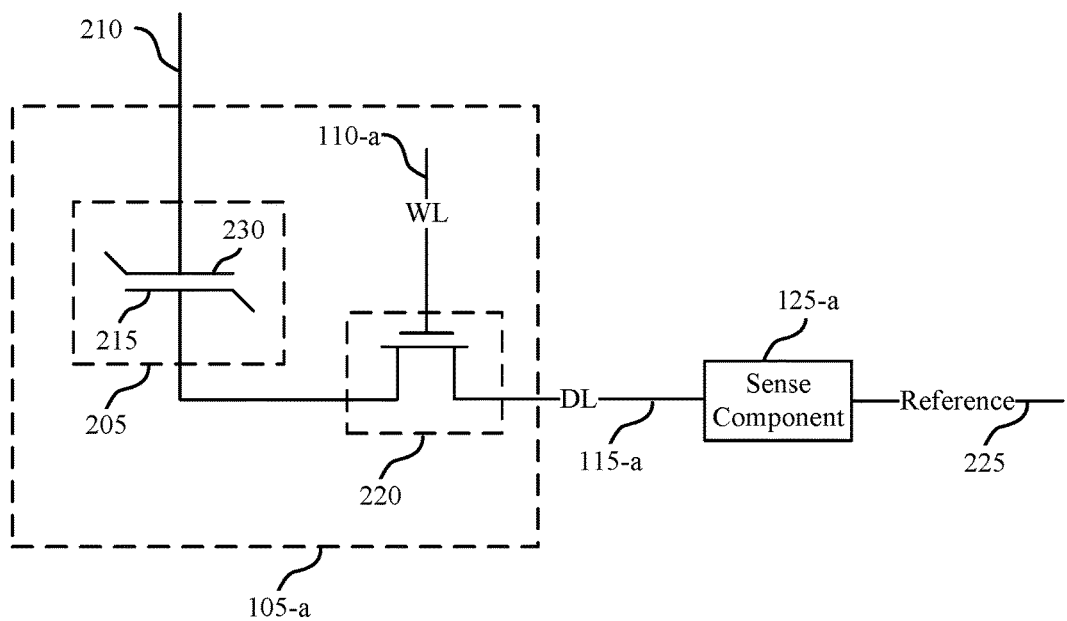
FIG. 2 illustrates an example circuit that supports a pulsed integrator and memory techniques in accordance with embodiments of the present disclosure.

FIG. 2 illustrates an example circuit 200 in accordance with various embodiments of the present disclosure. Circuit 200 includes a memory cell 105-a, word line 110-a, digit line 115-a, and sense component 125-a, which may be examples of a memory cell 105, word line 110, digit line 115, and sense component 125, respectively, as described with reference to FIG. 1. Memory cell 105-a may include a logic storage component, such as capacitor 205 that has a first plate, cell plate 230, and a second plate, cell bottom 215. Cell plate 230 and cell bottom 215 may be capacitively coupled through a dielectric material positioned between them, and the dielectric material may in some cases be a ferroelectric material. The orientation of cell plate 230 and cell bottom 215 may be flipped without changing the operation of memory cell 105-a. Circuit 200 also includes selection component 220 and reference line 225. Cell plate 230 may be accessed via plate line 210 and cell bottom 215 may be accessed via digit line 115-a. As described above, various states may be stored by charging or discharging capacitor 205.

The stored state of capacitor 205 may be read or sensed by operating various elements represented in circuit 200. Capacitor 205 may be in electronic communication with digit line 115-a. For example, capacitor 205 can be isolated from digit line 115-a when selection component 220 is deactivated, and capacitor 205 can be connected to digit line 115-a when selection component 220 is activated. Activating selection component 220 may be referred to as selecting memory cell 105-a. In some cases, selection component 220 is a transistor and its operation is controlled by applying a voltage to the transistor gate, where the voltage magnitude is greater than the threshold magnitude of the transistor. Word line 110-a may activate selection component 220; for example, a voltage applied to word line 110-a is applied to the transistor gate, connecting capacitor 205 with digit line 115-a.

In other examples, the positions of selection component 220 and capacitor 205 may be switched, such that selection component 220 is connected between plate line 210 and cell plate 230 and such that capacitor 205 is between digit line 115-a and the other terminal of selection component 220. In this embodiment, selection component 220 may remain in electronic communication with digit line 115-a through capacitor 205. This configuration may be associated with alternative timing and biasing for read and write operations.

In examples where the material between the plates of capacitor 205 is a ferroelectric material, and as discussed in more detail below, capacitor 205 may not discharge upon connection to digit line 115-a. In one scheme, to sense the logic state stored by ferroelectric capacitor 205, word line 110-a may be biased to select memory cell 105-a and a voltage may be applied to plate line 210. In some cases, digit line 115-a is virtually grounded and then isolated from the virtual ground, which may be referred to as "floating," prior to biasing plate line 210 and word line 110-a. Biasing plate line 210 may result in a voltage difference (e.g., plate line 210 voltage minus digit line 115-a voltage) across capacitor 205. The voltage difference may yield a change in the stored charge on capacitor 205, where the magnitude of the change in stored charge may depend on the initial state of capacitor 205—e.g., whether the initial state stored a logic 1 or a logic 0. This may cause a change in the voltage of digit line 115-a based on the charge stored on capacitor 205. Operation of memory cell 105-a by varying the voltage to cell plate 230 may be referred to as "moving cell plate."

The change in voltage of digit line 115-a may depend on its intrinsic capacitance. That is, as charge flows through digit line 115-a, some finite charge may be stored in digit line 115-a and the resulting voltage depends on the intrinsic capacitance. The intrinsic capacitance may depend on physical characteristics, including the dimensions, of digit line 115-a. Digit line 115-a may connect many memory cells 105 so digit line 115-a may have a length that results in a non-negligible capacitance (e.g., on the order of picofarads (pF)). In a conventional voltage sensing scheme, the resulting voltage of digit line 115-a may then be compared to a reference (e.g., a voltage of reference line 225) by sense component 125-a in order to determine the stored logic state in memory cell 105-a. As an alternative to a voltage sensing scheme, a sensing process based on a time measurement using a sense component (e.g., a pulsed integrator) as described herein may be used.

Sense component 125-a may include various transistors or amplifiers to detect and amplify a difference in signals, which may be referred to as latching. In some cases, the sense component 125-a may be or include a pulsed integrator as described herein, and the pulsed integrator may be configured to discharge memory cell 105-a using at least one current pulse until a voltage associated with memory cell 105-a reaches a reference voltage and determine the amount charge stored on capacitor 205 based at least in part on an amount of time and an amount of current required to until the voltage associated with memory cell 105-a reaches the reference voltage.

To write memory cell 105-a, a voltage may be applied across capacitor 205. Various methods may be used. In one example, selection component 220 may be activated through word line 110-a in order to electrically connect capacitor 205 to digit line 115-a. A voltage may be applied across capacitor 205 by controlling the voltage of cell plate 230 (through plate line 210) and cell bottom 215 (through digit line 115-a). To write a logic 0, cell plate 230 may be taken high, that is, a positive voltage may be applied to plate line 210, and cell bottom 215 may be taken low, e.g., virtually grounding or applying a negative voltage to digit line 115-a. The opposite process is performed to write a logic 1, where cell plate 230 is taken low and cell bottom 215 is taken high.

Figure 3:
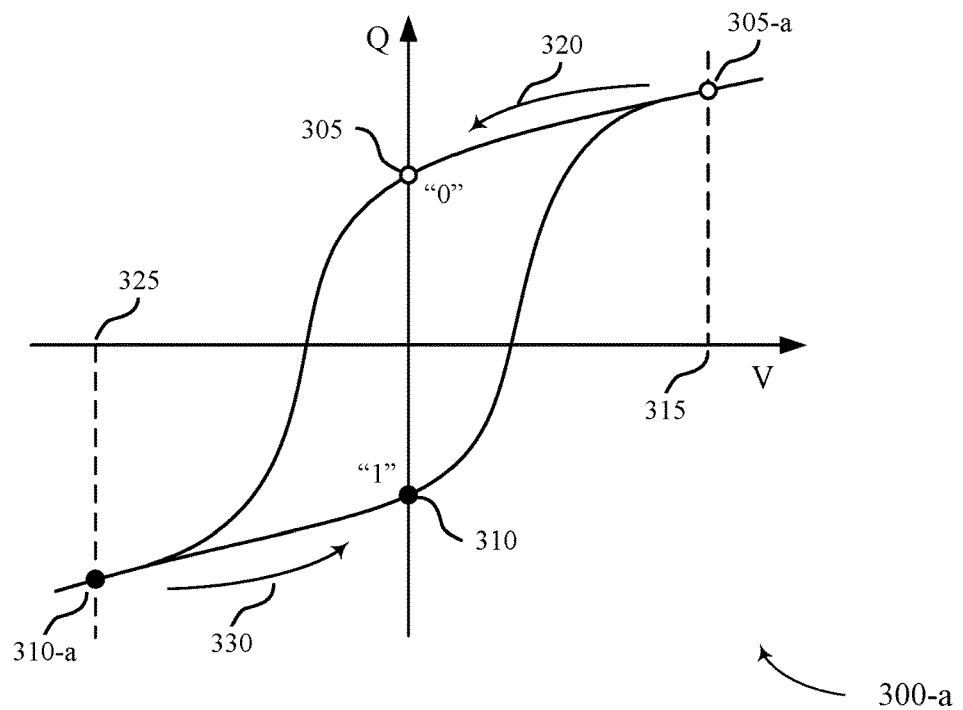
FIG. 3 illustrates example hysteresis plots for a ferroelectric memory cell that supports a pulsed integrator and memory techniques in accordance with embodiments of the present disclosure.
Figure 3:
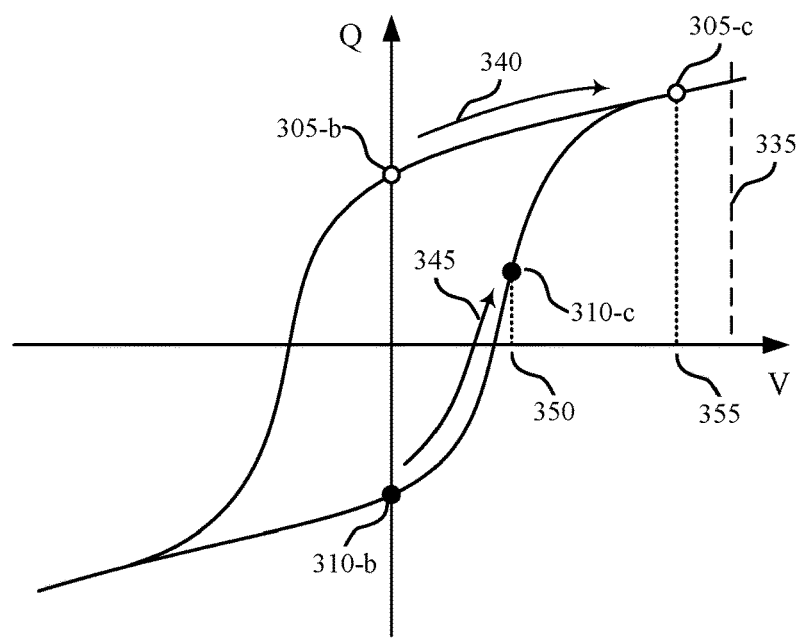

FIG. 3 illustrates example hysteresis plots 300-a and 300-b for a ferroelectric memory cell. Hysteresis plots 300-a and 300-b illustrate an example ferroelectric memory cell writing and reading process, respectively. The reading process corresponding to plot 300-b is an example of a conventional voltage sensing scheme but is nonetheless illustrative of ferroelectric memory cell behavior in general. Hysteresis plots 300-a and 300-b depict the charge, Q, stored on a ferroelectric capacitor (e.g., capacitor 205 of FIG. 2) as a function of a voltage difference, V.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis plots 300-a and 300-b may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis plots 300-a and 300-b represent a voltage difference across the capacitor and are directional. For example, a positive voltage may be realized by applying a positive voltage to the terminal in question (e.g., a cell plate 230) and maintaining the second terminal (e.g., a cell bottom 215) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis plots 300-a and 300-b.

As depicted in hysteresis plots 300-a and 300-b, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage. Similarly, charge state 310 is written by applying a net negative voltage 325, which results in charge state 310-a. After removing negative voltage 325, charge state 310-a follows path 330 until it reaches charge state 310 at zero voltage. Charge states 305 and 310 may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-*b* or 310-*b* was initially stored. For example, hysteresis plot 300-*b* illustrates two possible stored charge states 305-*b* and 310-*b*. Voltage 335 may be applied across the capacitor as discussed with reference to FIG. 2. In other cases, a fixed voltage may be applied to the cell plate and, although depicted as a positive voltage, voltage 335 may be negative. In response to voltage 335, charge state 305-*b* may follow path 340. Likewise, if charge state 310-*b* was initially stored, then it follows path 345. The final position of charge state 305-*c* and charge state 310-*c* depend on a number of factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not equal voltage 335 and instead may depend on the voltage of the digit line. The position of final charge states 305-*c* and 310-*c* on hysteresis plot 300-*b* may thus depend on the capacitance of the digit line and may be determined through a load-line analysis—i.e., charge states 305-*c* and 310-*c* may be defined with respect to the digit line capacitance. As a result, the voltage of the capacitor, voltage 350 or voltage 355, may be different and may depend on the initial state of the capacitor.

A conventional voltage sensing scheme may determine the initial state of the capacitor by comparing the digit line voltage to a reference voltage. The digit line voltage may be the difference between voltage 335 and the final voltage across the capacitor, voltage 350 or voltage 355—i.e., (voltage 335–voltage 350) or (voltage 335–voltage 355). In a conventional voltage scheme, a reference voltage may be generated such that its magnitude is between the two possible voltages of the two possible digit line voltages in order to determine the stored logic state—i.e., if the digit line voltage is higher or lower than the reference voltage. For example, the reference voltage may be an average of the two quantities, (voltage 335–voltage 350) and (voltage 335–voltage 355). Thus, a conventional voltage sensing scheme may use a voltage comparison to determine whether sensed digit line voltage is higher or lower than the reference voltage, and the stored logic value of the ferroelectric memory cell (i.e., a logic 0 or 1) may be determined based on that voltage comparison.

Rather than a conventional voltage sensing scheme, a pulsed integrator, in accordance with various embodiments of the present disclosure, may be used to determine an amount of stored charge in a memory cell, and thus the state of the memory cell, based at least in part on a discharge time.

Figure 4:
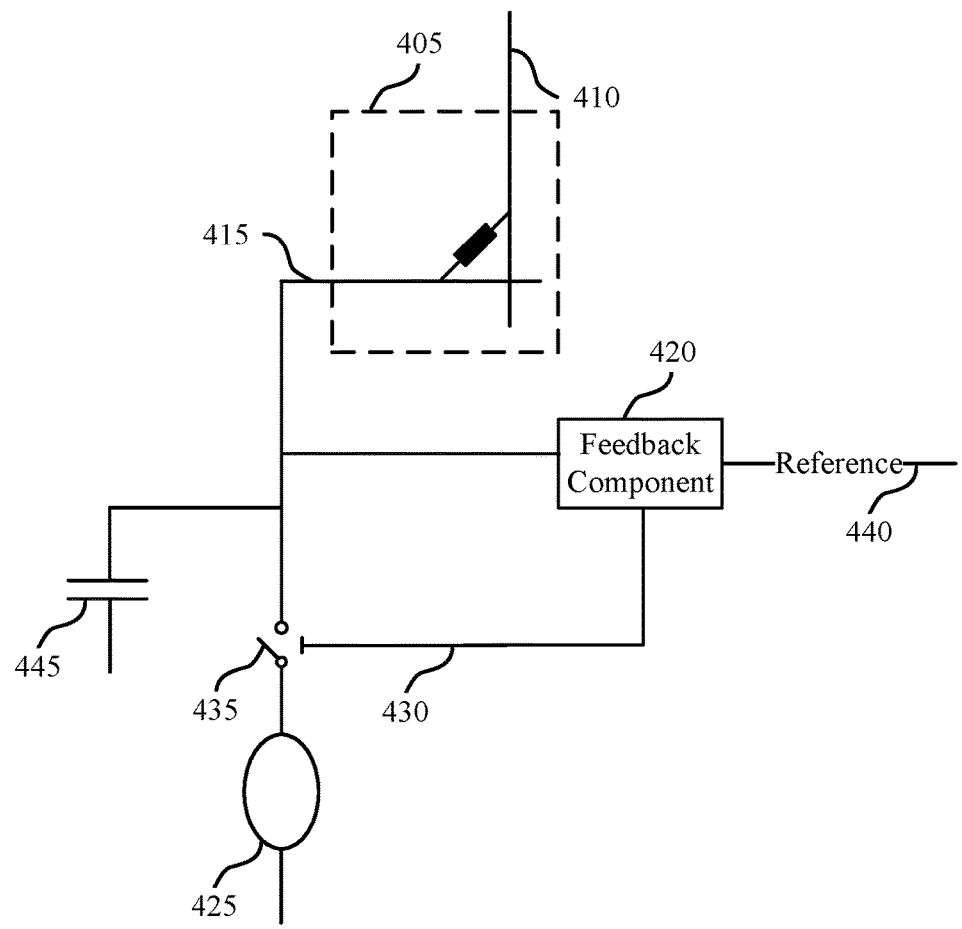
FIG. 4 illustrates an example circuit that supports a pulsed integrator and memory techniques in accordance with embodiments of the present disclosure.

FIG. 4 illustrates an example circuit 400 that supports a pulsed integrator and memory techniques in accordance with various embodiments of the present disclosure. Circuit 400 may include a memory cell 405, digit line 410, and word line 415. Word line 415 and digit line 410 may be interchangeable without loss of understanding or operation. In some cases, memory cell 405 may be an example of different type of memory cell than that described with reference to FIG. 2. For example, memory cell 405 may be an example of a memory cell within a cross-point memory array. In some cases, the memory cell 405 may be in a non-conductive state until a threshold voltage is reached. The voltage threshold may be a function of the state of the memory cell 405. In other cases, memory cell 405 may be an example of a memory cell 105-*a* as described with reference to FIG. 2, in which case one or more of the components of circuit 400 may be rearranged (e.g., sensing may be performed on a bit line such as digit line 115-*a* rather than on a word line).

Circuit 400 may also include feedback component 420, current sink 425, switch 435, reference line 440, and capacitor 445 (which may be a parasitic capacitance associated with word line 415). Feedback component 420 may be configured to monitor a voltage at word line 415 and operate switch 435 based at least in part on the voltage at word line 415. Feedback component 420 may, for example, comprise a differential or non-differential amplifier and other circuitry, such as an oscillator circuit. In examples where feedback component 420 comprises a differential amplifier, feedback component 420 may be configured to compare the voltage at word line 415 to the voltage on reference line 440. In examples where feedback component 420 comprises a non-differential amplifier, reference line 440 may represent an internal reference voltage (e.g., an internal reference dictated by the biasing of the non-differential amplifier), and feedback component 420 may be configured to amplify the voltage at word line 415 based on the internal reference voltage.

Memory cell 405 may accumulate a charge as a voltage (e.g., a constant voltage) is applied across memory cell 405 over a duration. As the accumulated charge increases, the voltage sensed on a select line (e.g., word line 415) may also increase. The charge accumulated within memory cell 405 may be extracted by current sink 425. Thus, current sink 425 may affect (e.g., dictate, control) the level of discharge current when memory cell 405 is discharged.

Current sink 425 may comprise a current mirror. Current sink 425 as described herein may be configured to discharge memory cell 405 using one or more current pulses, where each pulse may be configured to extract charge from memory cell 405 at a known current level.

Feedback component 420 may be in electronic communication with current sink 425. Feedback component 420 may be configured to activate current sink 425 when the voltage at word line 415 is above a reference voltage, such as the voltage at reference line 440, and cause memory cell 405 to discharge through current sink 425 until the voltage at word line 415 reaches the reference voltage. In some cases, activating current sink 425 may comprise operating switch 435 so as to either connect or disconnect current sink 425 with word line 415. Memory cell 405 may discharge when switch 435 is closed and may not discharge when switch 435 is open. Switch 435 may comprise, for example, one or more transistors. Switch 435 may be controlled by feedback component 420 via one or more control signals carried by feedback path 430. For example, feedback path 430 may be unidirectional from feedback component 420 to current sink 425.

In some cases, additional circuitry (not shown) may be implemented. For example, a timing component may be configured to measure a discharge time as the amount of time that current sink 425 is active (e.g., the amount of time switch 435 is closed) between when feedback component 420 initially activates current sink 425 (e.g., closes switch 435) and when the voltage at word line 415 reaches the reference voltage level. As described herein, current sink 425 may in some examples be active (e.g., continuously active) between when feedback component 420 initially activates current sink 425 (e.g., closes switch 435) and when the voltage at word line 415 reaches the reference voltage level. As also described herein, current sink 425 may, in some examples, be active for multiple pulses between when feedback component 420 initially activates current sink 425 (e.g., closes switch 435) and when the voltage at word line 415 reaches the reference voltage level. To determine the discharge time, and thus a state of memory cell 405, the timing component (e.g., a counter) may count a number of clock periods (e.g., clock periods or half-periods) or a number of current pulses required to discharge memory cell 405.

Circuit 400 may also include capacitor 445. Capacitor 445 may convert the charge extracted from memory cell 405 to a voltage, where the voltage may be supplied to feedback component 420. In some examples, capacitor 445 may be a parasitic capacitor or another type.

Figure 5:
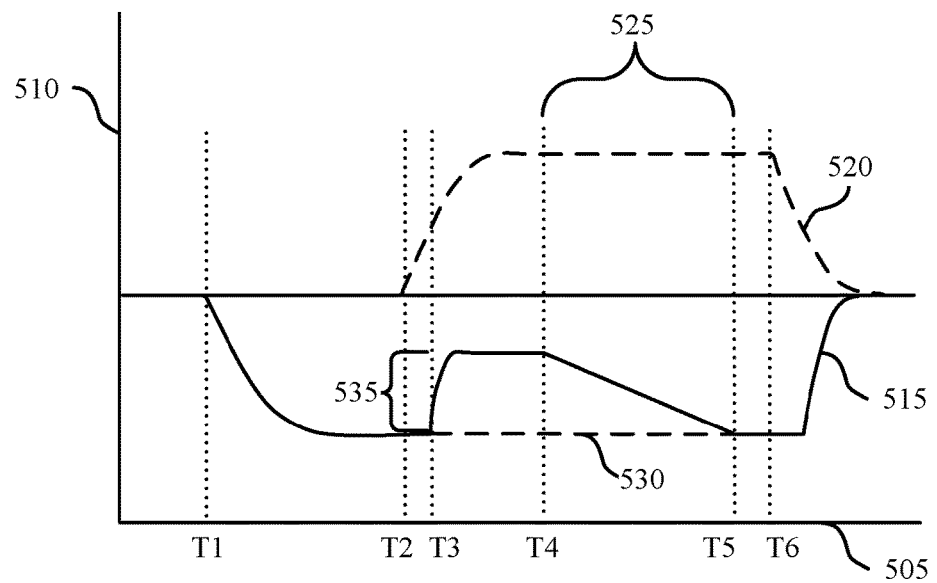
FIG. 5 illustrates an example voltage plot for a sensing operation using a pulsed integrator and memory techniques in accordance with embodiments of the present disclosure.

FIG. 5 illustrates an example voltage plot 500 for a sensing operation using a pulsed integrator and memory techniques in accordance with various embodiments of the present disclosure. Voltage plot 500 may include axis 505 and axis 510. Axis 505 may represent time, and axis 510 may represent voltage. Voltage plot 500 may also plot word line voltage 515 and bit line voltage 520 as a function of time. Word line voltage 515 and bit line voltage 520 may be interchangeable without loss of understanding or operation, in addition to word line 415 and digit line 410 as described with reference to FIG. 4.

To determine an amount of stored charge within memory cell 405, the discharge time of memory cell 405 may be determined based on the duration of one or more current pulses used to discharge memory cell 405 to a first voltage level (e.g., a reference voltage level related to reference line 440). In one example of a sense operation, word line 415 may be selected at time t1, which may cause word line voltage 515 to decrease. In some cases, when word line 415 is selected but digit line 410 is not selected, there may be insufficient voltage across memory cell 405 for additional charge to accumulate within memory cell 405.

Thus, at time t2, digit line 410 may be selected, which may cause the bit line voltage 520 to increase (and thus the voltage across memory cell 405—the difference between the bit line voltage 520 and the word line voltage 515—to increase).

At time t3, the word line voltage 515 may increase (e.g., due to charge accumulation within memory cell 405). The charge accumulated within memory cell 405 may be the polarization charge accumulated during a read operation. In some cases, the charge accumulated within memory cell 405 may depend on the initial state of memory cell 405. Additionally, the absolute voltage levels of memory cell 405, such as those illustrated in FIG. 5, may depend on the initial state of memory cell 405.

Voltage range 535 may represent the change in word line voltage 515 due to the additional charge accumulated across memory cell 405 as a result of the selection of word line 415 at time t1 and the selection of word line 415 at time t2. The amount of additional charge accumulated across memory cell 405 as a result of the selection of word line 415 at time t1 and the selection of word line 415 at time t2 may depend on the amount of charge stored in memory cell 405 prior to time t1. Thus, by extracting charge from memory cell 405 until word line voltage 515 returns to its pre-t3 level, and measuring the amount of extracted charge, the amount of charge stored in memory cell 405 prior to time t1 (and thus a state of memory cell 405) may be determined.

Feedback component 420 may control current sink 425 in order to discharge memory cell 405 when the word line voltage 515 is above the reference voltage, which may be configured to be equal to the pre-t3 level of word line voltage 515 (e.g., the reference voltage may be configured to be equal to voltage level 530). One or both of feedback component 420 or feedback path 430 may include some amount of delay (e.g., to allow word line voltage 515 to reach a steady state value prior to discharge). At time t4, current sink 425 may begin to discharge memory cell 405, which may cause word line voltage 515 to decrease. At time t5, word line voltage 515 may reach the reference voltage (e.g., return to voltage level 530), and feedback component 420 may control current sink 425 in order to cease discharging memory cell 405. At time t6, word line 415 and digit line 410 may be de-selected, and a voltage of word line 415 and a voltage of digit line 410 may return to zero.

In some cases, duration 525, which is the time between time t4 and time t5, may correspond to a time during which current sink 425 is active (e.g., continuously or intermittently) in order to discharge memory cell 405 until word line voltage 515 returns to the reference voltage. If current sink 425 is continuously active during duration 525, and thus discharges memory cell 405 via a single current pulse, the discharge time may be equal to duration 525. In such cases, discharge time (and thus the state of memory cell 405) may be measured based at least in part on a running clock signal and a number of clock periods that occur during duration 525. If current sink 425 is intermittently active during duration 525, and thus discharges memory cell 405 via multiple current pulses, each current pulse may have a same fixed width, and discharge time may be determined based at least in part on a pulse count during duration 525 (or, if pulses are aligned to a running clock signal, a number of clock periods that occur during duration 525).

Figure 6A:
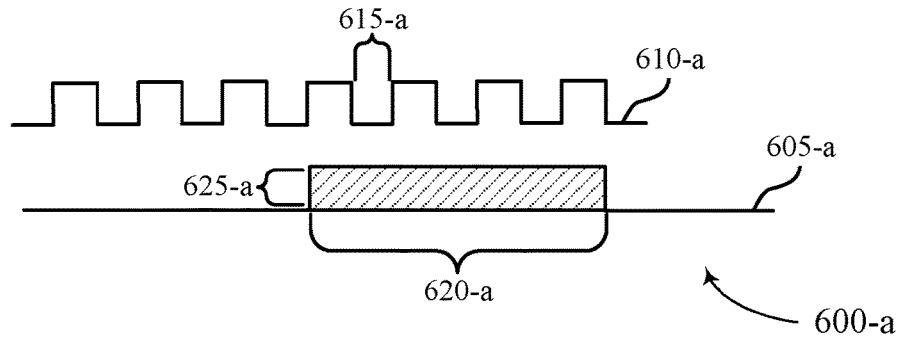
FIG. 6A illustrates an example of a timing diagram for a circuit that supports a pulsed integrator and memory techniques in accordance with embodiments of the present disclosure.

FIG. 6A illustrates an example of a timing diagram 600-a for a pulsed integrator and memory techniques in accordance with various embodiments of the present disclosure. Timing diagram 600-a may include single current pulse 605-a and running clock 610-a. Each half-period of running clock 610-a may comprise duration 615-a. Current pulse 605-a may have duration 620-a and magnitude 625-a. In some cases, magnitude 625-a of current pulse 605-a may be constant.

In some embodiments, current sink 425 may be configured to extract charge from memory cell 405 (e.g., as a single current pulse 605-a of a known magnitude 625-a). In a single pulse mode of operation, the amount of extracted charge may be determined based at least in part on the known discharge current level (e.g., magnitude 625-a) and the duration 620-a of the single current pulse 605-a (e.g., based on the discharge current level integrated over (e.g., multiplied by) the duration). Thus, the magnitude 625-a of single current pulse 605-a in combination with duration 620-a may be used to determine an amount of stored charge for memory cell 405.

In some cases, feedback component 420 may be configured to activate current sink 425 (e.g., close switch 435) to continuously extract charge from memory cell 405 via current pulse 605-a until a voltage associated with memory cell 405 (e.g., a select line voltage, such as word line voltage 515) reaches a reference voltage level. When the voltage associated with memory cell 405 reaches the reference voltage level, the feedback component 420 may be configured to deactivate current sink 425 (e.g., open switch 435). Thus, current pulse 605-a may begin at a first time (e.g., when feedback component 420 activates current sink 425)

and current pulse 605-*a* may end at a second, later time (e.g., when the voltage associated with memory cell 405 reaches the reference voltage), and the duration 620-*a* of single current pulse 605-*a* may be measured to determine an amount of charge extracted from memory cell 405 (and thus an amount of stored charge in memory cell 405 before a sense operation and thus a state of memory cell 405).

In some examples, the duration 620-*a* of current pulse 605-*a* may be measured based at least in part on an amount of time (e.g., a number of periods or half-periods) associated with running clock 610-*a* that occurs between the start and end times of single current pulse 605-*a*, which may be referred to as a clock count. In some cases, a clock count may be determined by a timing component, which in some cases may comprise a shift register. Further, as the clock count is reflective of the discharge time in some examples, and the discharge time is reflective of the amount of charge extracted from memory cell 405 in some examples, and the amount of extracted charge is reflective of the amount of stored charge within memory cell 405 in some examples, and the amount of stored charge within memory cell 405 is reflective of the state of memory cell 405 in some examples, the state of memory cell 405 may be determined based on a comparison of the measured clock count to a reference clock count—as the measured clock count may be higher or lower than the reference clock count depending upon the state of memory cell 405. Any number of reference clock counts may be used, depending on the number of states that memory cell 405 may be capable of storing.

Figure 6B:
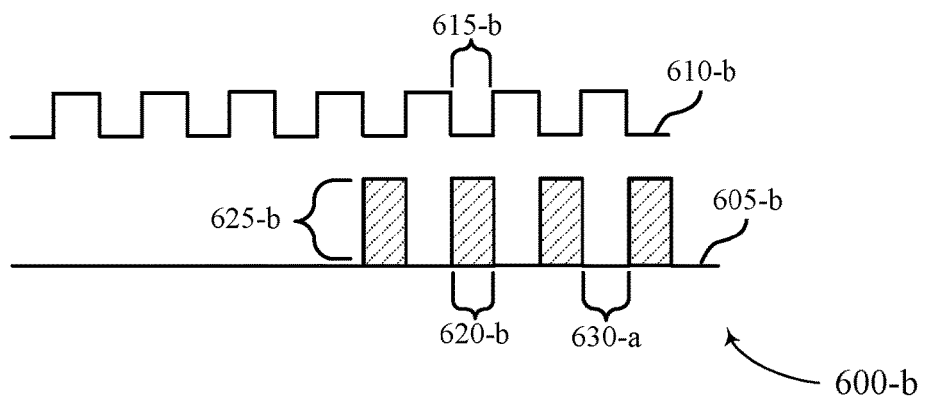
FIG. 6B illustrates an example of a timing diagram for a circuit that supports a pulsed integrator and memory techniques in accordance with embodiments of the present disclosure.

FIG. 6B illustrates an example of a timing diagram 600-*b* for a pulsed integrator and memory techniques in accordance with various embodiments of the present disclosure. Timing diagram 600-*b* may include current pulse set 605-*b* and running clock 610-*b*. Each half-period of running clock 610-*b* may comprise duration 615-*b*, and each current pulse within current pulse set 605-*b* may have duration 620-*b* and magnitude 625-*b*. In some examples, each current pulse in current pulse set 605-*b* may be of an equal duration 620-*b* (while in other examples the durations may be different). For example, duration 620-*b* (e.g., pulse width) may be equal to a half-period of running clock 610-*b*. Each current pulse in current pulse set 605-*b* may be separated by a same, fixed interval 630-*a*. Fixed interval 630-*a* may be based on the frequency of running clock 610-*b*.

As described herein, current sink 425 may be configured to extract charge from memory cell 405 via one or more current pulses. The current pulses may be aligned with a clock signal as are the current pulses in current pulse set 605-*b*. In a multi-pulse mode of operation, the amount of extracted charge may be determined based at least in part on the magnitude 625-*b* of each current pulse in current pulse set 605-*b* and the duration of each current pulse in current pulse set 605-*b*. For example, the magnitude 625-*b* of each current pulse in current pulse set 605-*b* may be a same constant value, and the amount of extracted charge may be determined based at least in part on the magnitude 625-*b* of each current pulse in current pulse set 605-*b* multiplied by the collective duration 620-*b* of the multiple current pulses in current pulse set 605-*b*. In some examples, each current pulse in current pulse set 605-*b* may have a same, fixed duration 620-*b* and a same, fixed magnitude 625-*b*, such that each current pulse in current pulse set 605-*b* represents a same, fixed amount of extracted charge. Thus, the number of current pulses in current pulse set 605-*b* may be used to determine an amount of stored charge (and thus a state) for memory cell 405.

In some cases, feedback component 420 may be configured to activate current sink 425 (e.g., close switch 435) in order to extract charge (e.g., intermittently) from memory cell 405 via current pulse set 605-*b* until a voltage associated with memory cell 405 (e.g., a select line voltage, such as word line voltage 515) reaches a reference voltage level. When the voltage associated with memory cell 405 reaches the reference voltage level, the feedback component 420 may be configured to deactivate current sink 425 (e.g., open switch 435), and thus stop the train of current pulses in current pulse set 605-*b*. Thus, the first current pulse of current pulse set 605-*b* may occur when feedback component 420 activates current sink 425 and the final current pulse of current pulse set 605-*b* may occur approximately when the voltage associated with memory cell 405 reaches the reference voltage, and the number of current pulses included in current pulse set 605-*b* may be measured in order to determine an amount of charge extracted from memory cell 405 (and thus an amount of stored charge in memory cell 405 before a sense operation and thus a state of memory cell 405).

As one example, current pulses in current pulse set 605-*b* may be aligned with periods, half-periods, or any multiple number of periods of running clock 610-*b*. The duration 620-*b* of each current pulse in current pulse set 605-*b* may be dictated by and thus known based on the alignment with running clock 610-*b* and the frequency of running clock 610-*b*. The discharge time for memory cell 405 may be determined based on the number of current pulses in current pulse set 605-*b* and the duration 620-*b* of each current pulse in current pulse set 605-*b*. For example, if each current pulse in current pulse set 605-*b* has a same, fixed duration 620-*b*, the discharge time for memory cell 405 may be determined by multiplying the number of current pulses in current pulse set 605-*b* by duration 620-*b*.

The number of current pulses in current pulse set 605-*b* may, in some examples, be referred to as a pulse count. In some examples, a pulse count may be measured based at least in part on a number of periods or half-periods of (or other durations associated with) running clock 610-*b* that occur between the start and end current pulse set 605-*b*, which may be referred to as a clock count. For example, if one current pulse in current pulse set 605-*b* occurs during each period of running clock 610-*b*, then the clock count is equal to the pulse count. In some examples, a pulse count may by measured by counting pulses on a control signal (e.g., feedback path 430) that controls the operation of either current sink 425 or switch 435. In some cases, a pulse count may be determined by a timing component, which in some cases may comprise a shift register or digital accumulator.

The timing component may determine a pulse count by counting pulses at a node reflective of the operation of current sink 425 or switch 435, such as a control signal on feedback path 430. Further, as the pulse count is reflective of the discharge time, and the discharge time is reflective of the amount of charge extracted from memory cell 405, and the amount of extracted charge is reflective of the amount of stored charge within memory cell 405, and the amount of stored charge within memory cell 405 is reflective of the state of memory cell 405, in some cases, the state of memory cell 405 may be determined based on a comparison of the measured pulse count to a reference pulse count—as the measured pulse count may be higher or lower than the reference pulse count depending upon the state of memory cell 405. Any number of reference pulse counts may be used, depending on the number of states that memory cell 405 may be capable of storing.

Figure 6C:
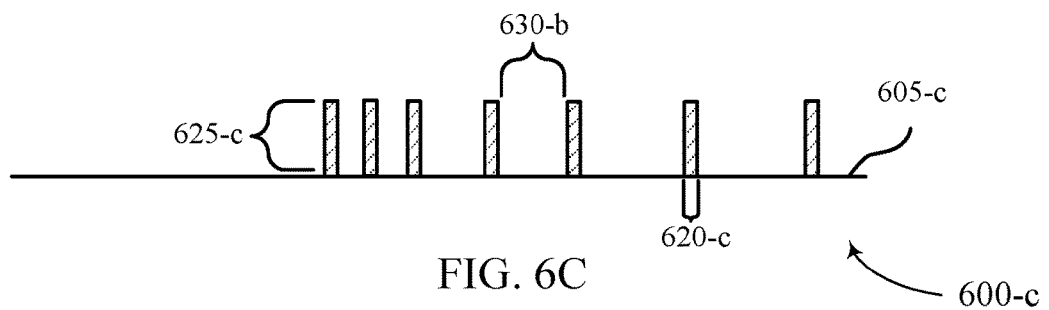
FIG. 6C illustrates an example of a timing diagram for a circuit that supports a pulsed integrator and memory techniques in accordance with embodiments of the present disclosure.

FIG. 6C illustrates an example of a timing diagram 600-c for a pulsed integrator and memory techniques in accordance with various embodiments of the present disclosure. Timing diagram 600-c may include current pulse set 605-c, and each current pulse within current pulse set 605-c may have duration 620-c and magnitude 625-c. In some examples, each current pulse in current pulse set 605-c may be of an equal duration 620-c. In some examples, each current pulse 605-c in the plurality of current pulses 605-c may be separated by variable interval 630-b. Thus, within current pulse set 605-c, the "on" time of current sink 425 (duration 620-c) may be fixed but the "off" time of current sink 425 (variable interval 630-b) may be variable. Variable interval 630-b may be based on a control signal output by feedback component 420. That is, variable interval 630-b may be shorter or longer depending on the voltage sensed by feedback component 420. In some examples, variable interval 630-b may be relatively shorter when the voltage sensed by feedback component 420 is relatively higher.

As another example, current sink 425 may be configured to extract charge from memory cell 405 via multiple current pulses, and the timing with which the current pulses occur may be variable and based on a signal generated within feedback component 420, such as the current pulses in current pulse set 605-c. That is, charge may be extracted from memory cell 405 via multiple current pulse of current pulse set 605-c, each including a same discharge current level (e.g., magnitude 625-c) and duration (e.g., duration 620-c), but the interval 630-b between pulses may be variable. In a multi-pulse, variable interval mode of operation, the amount of extracted charge may be determined based at least in part on the magnitude 625-c of each current pulse in current pulse set 605-c and the duration of each current pulse in current pulse set 605-c. For example, the magnitude 625-c of each current pulse 605-c may be a same constant value, and the amount of extracted charge may be determined based at least in part on the magnitude 625-c of each current pulse in current pulse set 605-c multiplied by the collective duration 620-c of the multiple current pulses in current pulse set 605-c. In some examples, each current pulse in current pulse set 605-c may have a same, fixed duration 620-c and a same, fixed magnitude 625-c, such that each current pulse in current pulse set 605-c represents a same, fixed amount of extracted charge. Thus, the number of current pulses in current pulse set 605-c may be used to determine an amount of stored charge (and thus a state) for memory cell 405.

In some cases, feedback component 420 may be configured to activate current sink 425 (e.g., close switch 435) in order to intermittently extract charge from memory cell 405 via current pulse set 605-c until a voltage associated with memory cell 405 (e.g., word line voltage 515) reaches a reference voltage level. When the voltage associated with memory cell 405 reaches the reference voltage level, the feedback component 420 may be configured to deactivate current sink 425 (e.g., open switch 435), and thus stop the train of current pulses in current pulse set 605-c. Thus, the first current pulse of current pulse set 605-c may occur when feedback component 420 activates current sink 425 and the final current pulse of current pulse set 605-c may occur approximately when the voltage associated with memory cell 405 reaches the reference voltage, and the number of current pulses included in current pulse set 605-c may be measured in order to determine an amount of charge extracted from memory cell 405 (and thus an amount of stored charge in memory cell 405 prior to a sense operation and thus a state of memory cell 405).

As one example, current pulses in current pulse set 605-c may not be aligned with a running clock. Rather, an oscillator may be implemented within feedback component 420. The oscillator may be configured such that each time feedback component 420 activates current sink 425 (e.g., closes switch 435), the associated control signal changes state (e.g., goes from high to low) after a predetermined amount of time. That is, each time feedback component 420 activates current sink 425, feedback component 420 deactivates current sink 425 a predetermined amount of time later, the predetermined amount of time dictated by the oscillator. Thus, each current pulse in current pulse set 605-c may have a same, fixed duration 620-c but a variable separation interval 630-c that may be proportional to the voltage sensed by the feedback component (e.g., may be proportional to word line voltage 515).

The duration 620-c of each current pulse in current pulse set 605-c may be dictated by and thus relate to and be based on the oscillator configuration. The discharge time for memory cell 405 may be determined based on the number of current pulses in current pulse set 605-c and the duration 620-c of each current pulse in current pulse set 605-c. For example, if each current pulse in current pulse set 605-c has a same, fixed duration 620-c, the discharge time for memory cell 405 may be determined by multiplying the number of current pulses in current pulse set 605-c by duration 620-c.

The number of current pulses in current pulse set 605-c may, in some examples, be referred to as a pulse count. In some cases, a pulse count may be determined by a timing component, which in some cases may comprise a shift register or digital accumulator. The timing component may determine a pulse count by counting pulses at a node reflective of the operation of current sink 425 or switch 435, such as a control signal on feedback path 430. Further, as the pulse count is reflective of the discharge time in some examples, and the discharge time is reflective of the amount of charge extracted from memory cell 405 in some examples, and the amount of extracted charge is reflective of the amount of stored charge within memory cell 405 in some examples, and the amount of stored charge within memory cell 405 is reflective of the state of memory cell 405 in some examples, the state of memory cell 405 may be determined based on a comparison of the measured pulse count to a reference pulse count—as the measured pulse count may be higher or lower than the reference pulse count depending upon the state of memory cell 405. Any number of reference pulse counts may be used, depending on the number of states that memory cell 405 may be capable of storing.

Figure 7:
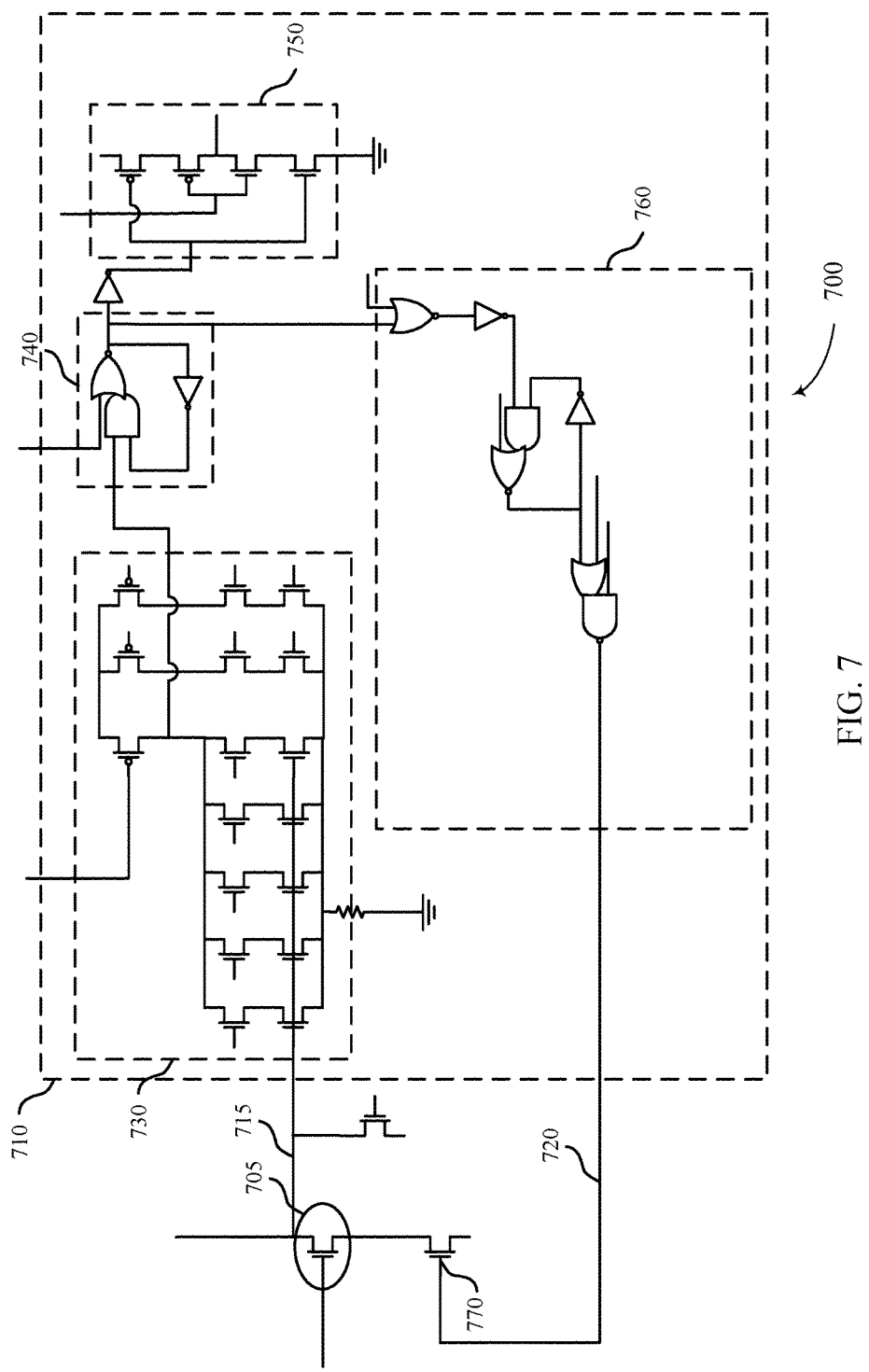
FIG. 7 illustrates an example circuit that supports a pulsed integrator and memory techniques in accordance with embodiments of the present disclosure.

FIG. 7 illustrates an example of circuit 700 that supports a pulsed integrator and memory techniques in accordance with various embodiments of the present disclosure. Circuit 700 may include current sink 705, feedback component 710, feedback path 720, and switch 770. Feedback component 710 may comprise sense amplifier 730, latch 740, buffer 750, and feedback logic 760. Circuit 700 is an example of a circuit that may determine the state of the memory cell by discharging the memory cell via a single current pulse and integrating the amount of extracted charge, as described with reference to FIG. 6A, among other aspects of the present disclosure. Current sink 705, feedback component 710, feedback path 720 and switch 770 may be an example of current sink 425, feedback component 420, feedback path 430, and switch 435 in reference to FIG. 4.

Feedback component 710 may be in electronic communication with current sink 705. Feedback component 710 may activate current sink 705 based on comparing a voltage associated with a memory cell 405 (e.g., a select line voltage, such as word line voltage 715) to a reference voltage. Current sink 705 may also be in electronic communication with the memory cell 405, and possibly also with other memory cells in the memory array. In some cases, sense amplifier 730 may be a differential amplifier configured to output a signal based on how the voltage associated with the memory cell 405 compares with (e.g., is higher or lower than) the reference voltage. In some cases, latch 740 may be in electronic communication with sense amplifier 730. Latch 740 may be configured to capture a change of state of the output of sense amplifier 730.

Additionally, buffer 750 may be in electronic communication with latch 740, and buffer 750 may be configured to supply the signal output by latch 740 to a timing component, such as a shift register (not shown). In some cases, a clock signal may be supplied to feedback component 710 and feedback logic 760 in order to determine the discharge time of the memory cell. That is, the discharge time may be the duration of a single current pulse, and the duration of the single current pulse may be measured based on the clock signal, as described with reference to FIG. 6A, among other aspects of the present disclosure. Feedback logic 760 may be in electronic communication with the output of latch 740 and may also be in electronic communication with switch 770 via feedback path 720 in order to control current sink 705 based on the output of sense amplifier 730 and latch 740. In some examples, feedback logic 760 may be configured to introduce delay into feedback path 720 in order to allow the voltage associated with the memory cell 405 (e.g., word line voltage 715) to reach a steady state prior to discharge, such as the delay shown in FIG. 5 between t3 and t4.

Figure 8:
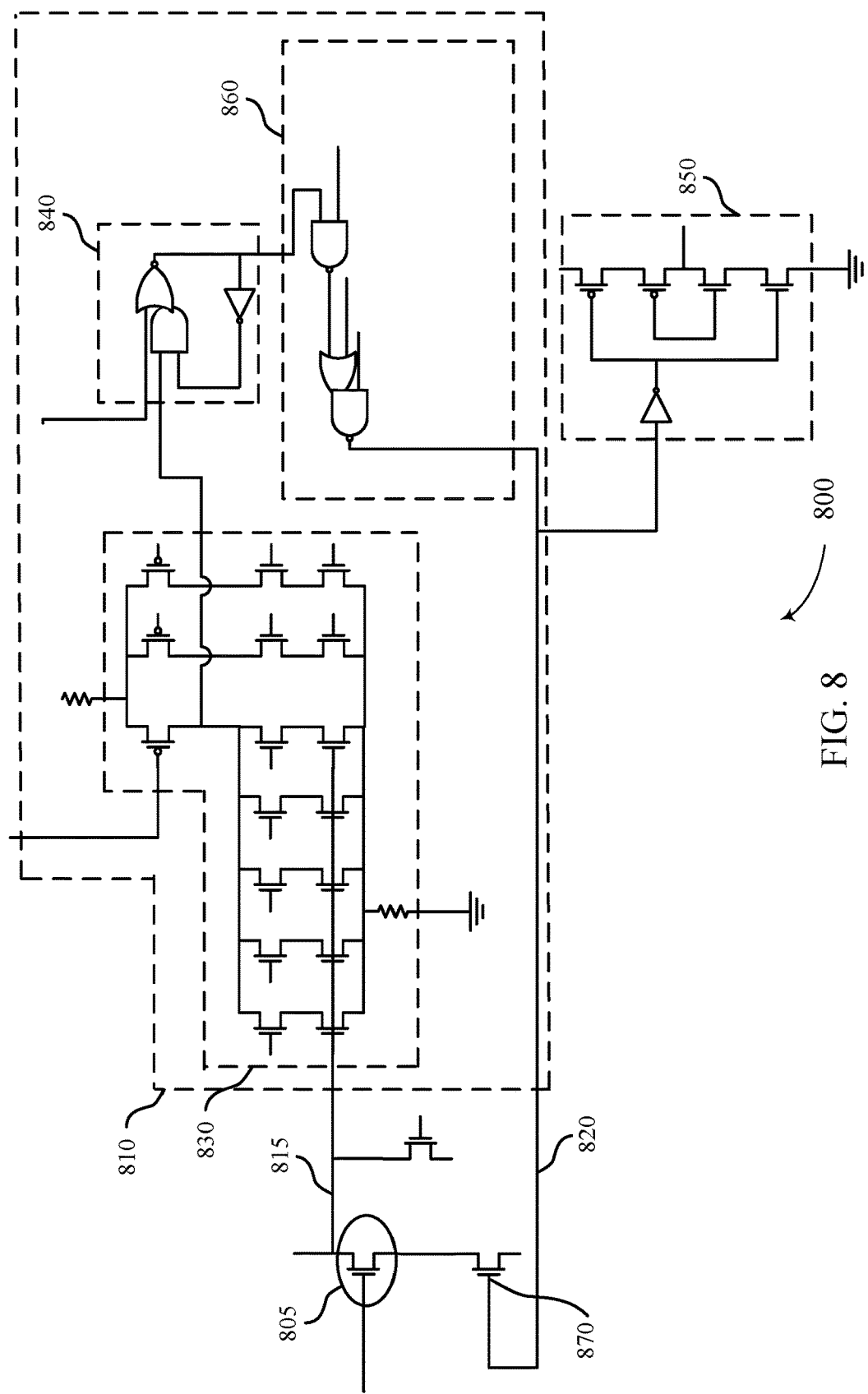
FIG. 8 illustrates an example of circuit that supports a pulsed integrator and memory techniques in accordance with embodiments of the present disclosure.

FIG. 8 illustrates an example of circuit 800 that supports a pulsed integrator and memory techniques in accordance with various embodiments of the present disclosure. Circuit 800 may include current sink 805, feedback component 810, feedback path 820, timing component 850, and switch 870. Feedback component 810 may comprise sense amplifier 830, latch 840, and feedback logic 860. Circuit 800 is an example of a circuit that may determine the state of the memory cell by discharging the memory cell via multiple current pulses and integrating the amount of extracted charge. Each of the multiple current pulses may be aligned with a running clock, as described with reference to FIG. 6B, among other aspects of the present disclosure. Current sink 805, feedback component 810, feedback path 820 and switch 870 may be an example of current sink 425, feedback component 420, feedback path 430, and switch 435 as described with reference to FIG. 4.

Feedback component 810 may be in electronic communication with current sink 805. Feedback component 810 may activate current sink 805 based on comparing a voltage associated with a memory cell 405 (e.g., a select line voltage, such as word line voltage 815) to a reference voltage. Current sink 805 may also be in electronic communication with the memory cell 405, and possibly also with other memory cells in the memory array. In some cases, sense amplifier 830 may be a differential amplifier configured to output a signal based on whether the voltage associated with the memory cell 405 is higher or lower than the reference voltage. In some cases, latch 840 may be in electronic communication with sense amplifier 830. Latch 840 may be configured to capture a change of state of the output of sense amplifier 830.

Feedback logic 860 may be in electronic communication with the output of latch 840 and may also be in electronic communication with switch 870 via feedback path 820 in order to control current sink 805 based on the output of sense amplifier 830 and latch 840. In some examples, feedback logic 860 may be configured to introduce delay into feedback path 820 in order to allow the voltage associated with the memory cell 405 (e.g., word line voltage 815) to reach a steady state prior to discharge, such as the delay shown in FIG. 5 between t3 and t4. Feedback component 810 may be configured to operate switch 870 so as to discharge memory cell 405 via clock-aligned current pulses until the voltage associated with the memory cell 405 reaches the reference voltage. The discharge time may be measured based on the collective duration of one or more current pulses, and the duration of each current pulse may be dictated by a clock signal, as described with reference to FIG. 6B, among other aspects of the present disclosure. A pulse count may be captured by a timing component 850. Timing component 850 may be or include, for example, a shift register configured to count pulses of a control signal on feedback path 820.

Figure 9:
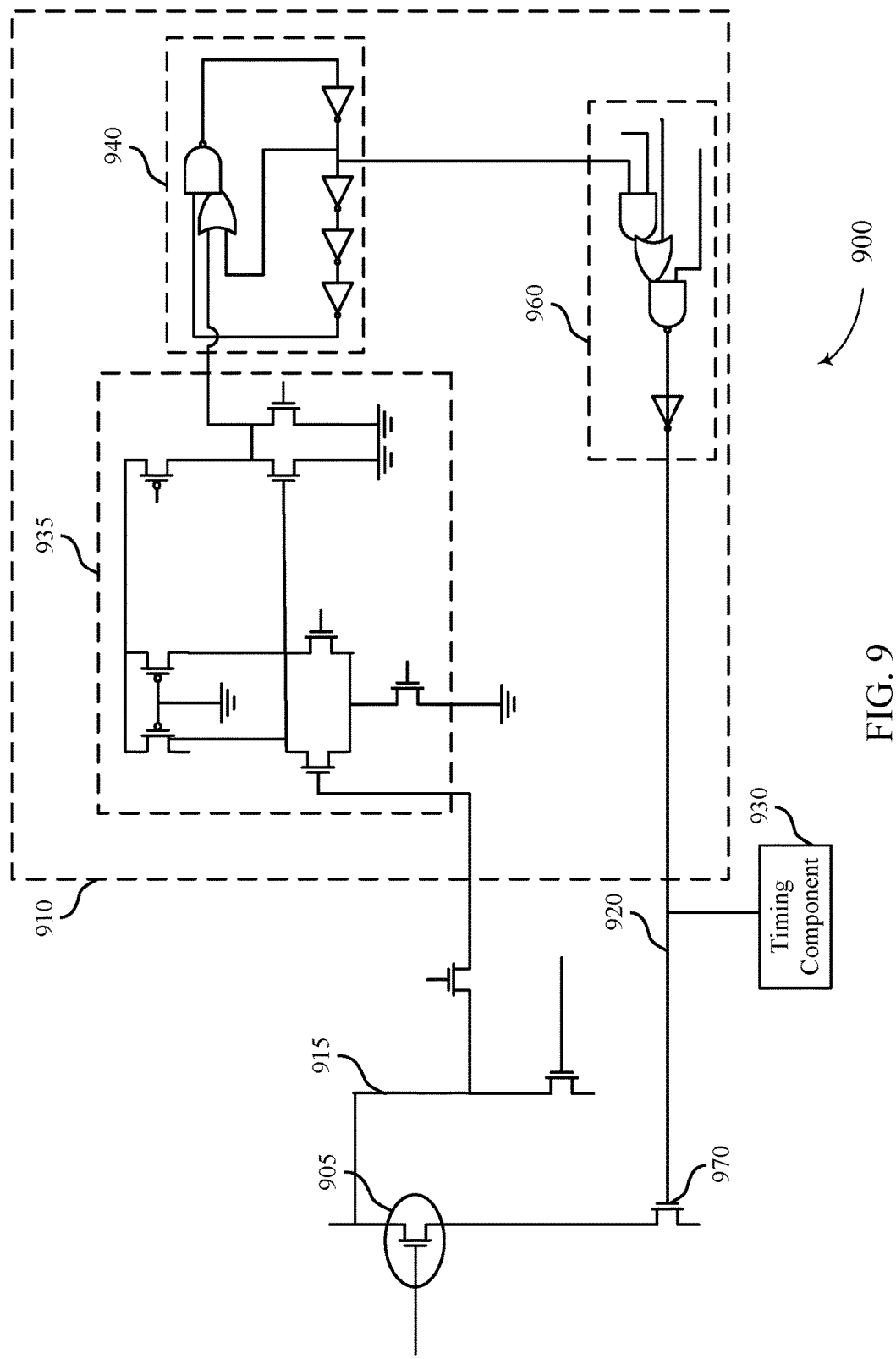
FIG. 9 illustrates an example of circuit that supports a pulsed integrator and memory techniques in accordance with embodiments of the present disclosure.

FIG. 9 illustrates an example of circuit 900 that supports a pulsed integrator and memory techniques in accordance with various embodiments of the present disclosure. Circuit 900 may include current sink 905, feedback component 910, feedback path 920, timing component 930, and switch 970. Feedback component 910 may comprise sense amplifier 935, oscillator 940, and feedback logic 960. Circuit 900 is an example of a circuit that may determine the state of the memory cell by discharging the memory cell via multiple current pulses and integrating the amount of extracted charge. Each of the multiple current pulses may be generated with a same, fixed duration governed by oscillator 940, though the interval between pulses may be variable, as described with reference to FIG. 6C, among other aspects of the present disclosure. Current sink 905, feedback component 910, feedback path 920, and switch 970 may be an example of current sink 425, feedback component 420, feedback path 430, and switch 435 described with reference to FIG. 4.

Feedback component 910 may be in electronic communication with current sink 905. Feedback component 910 may activate current sink 905 based on comparing a voltage associated with a memory cell 405 (e.g., a select line voltage, such as word line voltage 915) to a reference voltage. Current sink 905 may also be in electronic communication with the memory cell 405, and possibly also with other memory cells in the memory array. In some cases, sense amplifier 935 may be a differential amplifier configured to output a signal based on whether the voltage associated with the memory cell 405 is higher or lower than the reference voltage. In other cases, sense amplifier 935 may be a non-differential amplifier configured to output a signal based on whether the voltage associated with the memory cell 405 is higher or lower than an internal reference voltage.

In some cases, oscillator 940 may be in electronic communication with sense amplifier 935. Oscillator 940 may be configured to detect a change of state in the output of sense amplifier 935 and change the state of a control signal on feedback path 920 a fixed, predetermined amount of time later. Thus, each pulse in the control signal may have a same, fixed duration configured by oscillator 940 but a variable separation interval based on word line voltage 915. Feedback logic 960 may be in electronic communication with the output of oscillator 940 and may also be in electronic communication with switch 970 via feedback path 920 in order to control current sink 905 based on the output of sense amplifier 935 and oscillator 940. In some examples, feedback logic 960 may be configured to introduce delay into feedback path 920 in order to allow the voltage associated with the memory cell 405 (e.g., word line voltage 915) to reach a steady state prior to discharge, such as the delay shown in FIG. 5 between t3 and t4. Feedback component 910 may be configured to operate switch 970 so as to discharge memory cell 405 via current pulses having a duration set by oscillator 940 and separated by variable time intervals until the voltage associated with the memory cell 405 reaches the reference voltage. The discharge time may be measured based on the collective duration of the multiple current pulses, as described with reference to FIG. 6C, among other aspects of the present disclosure. A pulse count may be determined by timing component 930. Timing component 930 may be or include, for example, a shift register or a digital accumulator configured to count pulses of a control signal on feedback path 920.

Figure 10A:
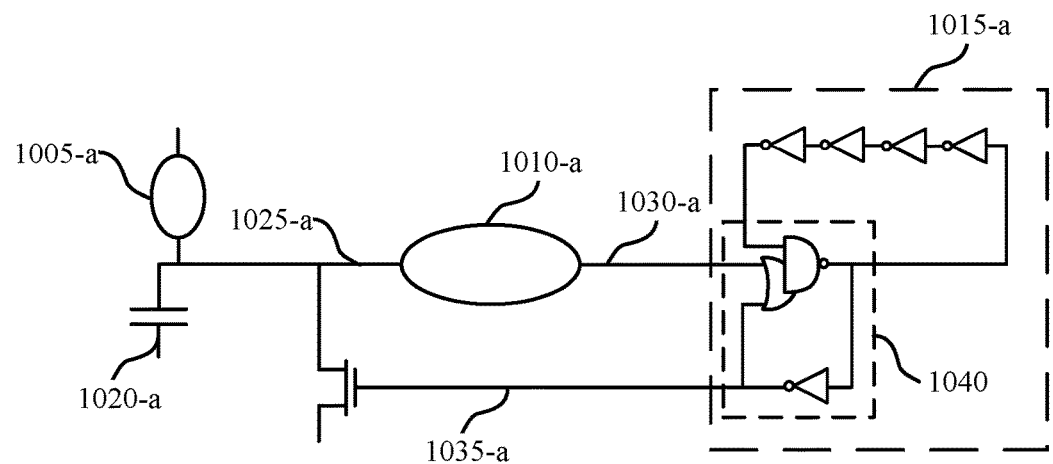
FIG. 10A illustrates an example circuit that supports a pulsed integrator and memory techniques in accordance with embodiments of the present disclosure.

FIG. 10A illustrates an example circuit 1000-a that supports a pulsed integrator and memory techniques in accordance with various embodiments of the present disclosure. Circuit 1000-a may include current sink 1005-a, sense amplifier 1010-a, oscillator 1015-a, and capacitor 1020-a. Circuit 1000-a may also include input signal 1025-a, output signal 1030-a, and feedback path 1035-a. Current sink 1005-a, capacitor 1020-a, and feedback path 1035-a may be examples of a current sink 425, capacitor 445, and feedback path 430, respectively, as described with reference to FIG. 4. Circuit 1000-a may illustrate one or more aspects of circuit 900.

Capacitor 1020-a may convert charge accumulated at a node of a memory cell 405 (e.g. a word line 415) to a sensed voltage. Input signal 1025-a may be the sensed voltage (e.g., word line voltage 515). Sense amplifier 1010-a may be a differential amplifier with an external reference voltage or a non-differential amplifier with an internal reference voltage configured to compare input signal 1025-a to the reference voltage level such that output signal 1030-a is in a high state if input signal 1025-a is greater than the reference voltage level and output signal 1030-a is in a low state if input signal 1025-a is less than the reference voltage level.

Output signal 1030-a may be configured to trigger latch 1040, which is within oscillator 1015-a and in electronic communication with sense amplifier 1010-a. Oscillator 1015-a may comprise an internal feedback loop that may be configured to have a certain fixed amount of delay (e.g., the latch feedback loop may include a series of logically neutral NOT gates as shown in oscillator 1015-a), such that the output of latch 1040 will reflect the state of output signal 1030-a until it propagates through the latch feedback loop and resets latch 1040.

Thus, when input signal 1025-a becomes greater than the reference voltage level, output signal 1030-a will enter a high state, and the output of latch 1040 may become high until it propagates through the delay in the latch feedback loop. Using the output of latch 1040 as a control signal for current sink 1005-a may therefore cause current sink 1005-a to become active and extract charge from the memory cell via a pulse having a fixed duration based on the fixed amount of delay in the latch feedback loop. Thus, a feedback component 420 comprising oscillator 1015-a may generate a control signal coupled with current sink 1005-a via feedback path 1035-a that causes current sink 1005-a to discharge the memory cell via fixed duration pulses at variable intervals so long as the sensed voltage is greater than the reference voltage level, as described with reference to FIG. 6C, among other aspects of the present disclosure.

Alternatively, the feedback loop within oscillator 1015-a may be removed, in which case the feedback component may generate a control signal coupled with current sink 1005-a via feedback path 1035-a that causes current sink 1005-a to discharge the memory cell continuously, as a single pulse, so long as the sensed voltage is greater than the reference voltage level, as described with reference to FIG. 6A and FIG. 7, among other aspects of the present disclosure.

Figure 10B:
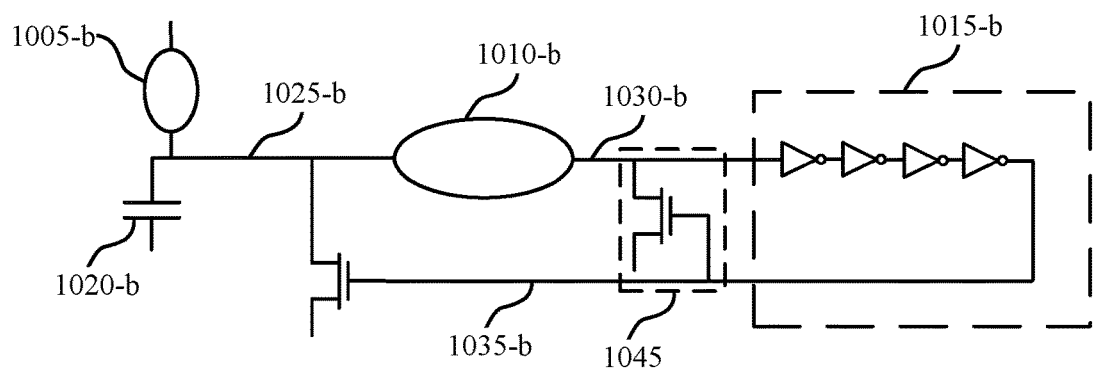
FIG. 10B illustrates an example circuit that supports a pulsed integrator and memory techniques in accordance with embodiments of the present disclosure.

FIG. 10B illustrates an example circuit 1000-b that supports a pulsed integrator and memory techniques in accordance with various embodiments of the present disclosure. Circuit 1000-b includes current sink 1005-b, sense amplifier 1010-b, oscillator 1015-b, and capacitor 1020-b. Circuit 1000-b also includes input signal 1025-b, output signal 1030-b, and feedback path 1035-b. Current sink 1005-b, capacitor 1020-b, and feedback path 1035-b may be examples of a current sink 425, capacitor 445, and feedback path 430, respectively, as described with reference to FIG. 4. Circuit 1000-b may illustrate one or more aspects, including alternative implementations, of circuit 900.

Capacitor 1020-b may convert charge accumulated at a node of the memory cell (e.g. a word line 415) to a sensed voltage. Input signal 1025-a may be the sensed voltage (e.g., word line voltage 515). Sense amplifier 1010-a may be a differential amplifier with an external reference voltage or a non-differential amplifier with an internal reference voltage configured to compare input signal 1025-a to the reference voltage level such that output signal 1030-a is in a high state if input signal 1025-a is greater than the reference voltage level and output signal 1030-a is in a low state if input signal 1025-a is less than the reference voltage level.

Output signal 1030-b may be configured to pass through a certain fixed amount of delay (e.g., may be configured to pass through a series of logically neutral NOT gates as shown in oscillator 1015-b) before, via feedback path 1035-b, activating a pull-down component 1045. Pull-down component 1045 may reduce the voltage of output signal 1030-b sufficiently to change the state of the logical gates in the delay path within oscillator 1015-b, which—after the same fixed amount of delay—will deactivate pull-down component 1045, causing output signal 1030-b to increase so as to again change the state of the logical gates in the delay path within oscillator 1015-b, thus restarting the oscillation process.

Oscillator 1015-b may continue to oscillate until the voltage of input signal 1025-b reaches a value below the reference voltage. In some cases, oscillator 1015-b may continue to oscillate until the word line stabilizes at a voltage. Thus, oscillator 1015-b may generate a control signal coupled with current sink 1005-b via feedback path 1035-b that causes current sink 1005-b to discharge the memory cell via fixed duration pulses at variable intervals so long as the sensed voltage is greater than a reference voltage level, as described with reference to FIG. 6C, among other aspects of the present disclosure.

Figure 11:
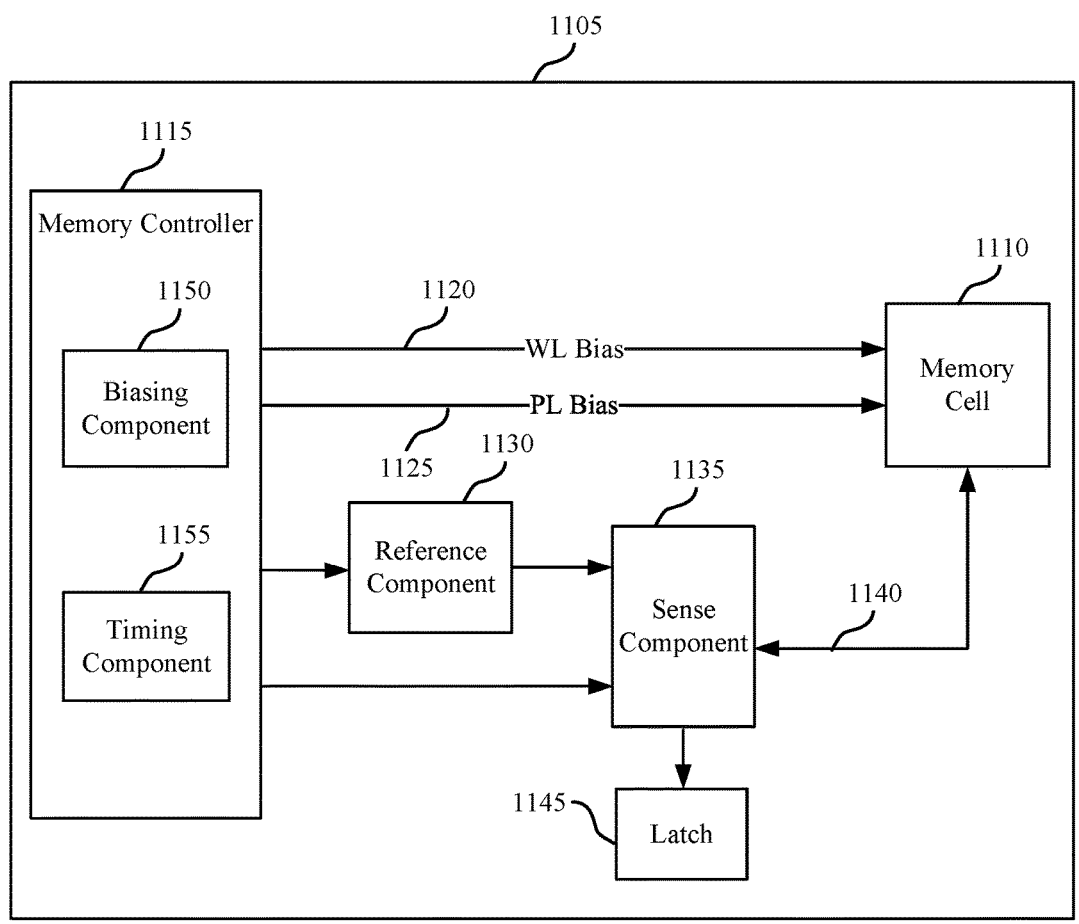
FIG. 11 illustrates a diagram of a memory array that supports a pulsed integrator and memory techniques in accordance with embodiments of the present disclosure.

FIG. 11 illustrates a block diagram 1100 of a memory array 1105 that supports a pulsed integrator and memory techniques in accordance with embodiments of the present disclosure. Memory array 1105 may be referred to as an electronic memory apparatus, and may be an example of a component of a current pulse manager as described herein.

Memory array 1105 may include one or more memory cells 1110, a memory controller 1115, a word line 1120, a plate line 1125, a reference component 1130, a sense component 1135, a digit line 1140, and a latch 1145. These components may be in electronic communication with each other and may perform one or more of the functions described herein. In some cases, memory controller 1115 may include biasing component 1150 and timing component

1155. In some cases, sense component 1135 may serve as the reference component 1130. In other cases, reference component 1130 may be optional.

Memory controller 1115 may be in electronic communication with word line 1120, digit line 1140, sense component 1135, and plate line 1125, which may be examples of word line 110, digit line 115, sense component 125, and plate line 210 described with reference to FIGS. 1 and 2. Memory array 1105 may also include reference component 1130 and latch 1145. The components of memory array 1105 may be in electronic communication with each other and may perform aspects of the functions described with reference to FIGS. 1 through 10. In some cases, reference component 1130, sense component 1135, and latch 1145 may be components of memory controller 1115.

In some examples, digit line 1140 is in electronic communication with sense component 1135 and a ferroelectric capacitor of ferroelectric memory cells 1110. A ferroelectric memory cell 1110 may be writable with a logic state (e.g., a first or second logic state). Word line 1120 may be in electronic communication with memory controller 1115 and a selection component of ferroelectric memory cell 1110. Plate line 1125 may be in electronic communication with memory controller 1115 and a plate of the ferroelectric capacitor of ferroelectric memory cell 1110. Sense component 1135 may be in electronic communication with memory controller 1115, digit line 1140, and latch 1145. Reference component 1130 may be in electronic communication with memory controller 1115. These components may also be in electronic communication with other components, both inside and outside of memory array 1105, in addition to components not listed above, via other components, connections, or buses.

Memory controller 1115 may be configured to activate word line 1120, plate line 1125, or digit line 1140 by applying voltages to those various nodes. For example, biasing component 1150 may be configured to apply a voltage to operate memory cell 1110 to read or write memory cell 1110 as described above. In some cases, memory controller 1115 may include a row decoder, column decoder, or both, as described herein. This may enable memory controller 1115 to access one or more memory cells 105. Biasing component 1150 may also provide voltage to reference component 1130 in order to generate a reference signal for sense component 1135. Additionally, biasing component 1150 may provide voltage for the operation of sense component 1135.

In some cases, memory controller 1115 may perform its operations using timing component 1155. For example, timing component 1155 may control the timing of the various word line selections or plate biasing, including timing for switching and voltage application to perform the memory functions, such as reading and writing, discussed herein. In some cases, timing component 1155 may control the operations of biasing component 1150.

Reference component 1130 may include various components to generate a reference signal for sense component 1135. Reference component 1130 may include circuitry configured to produce a reference signal. In some cases, reference component 1130 may be implemented using other ferroelectric memory cells 105. Sense component 1135 may comprise one or more pulsed integrators as described herein, with each pulsed integrator configured to determine a logic state of one or more memory cells 405 as described herein. Upon determining the logic state, the sense component 1135 may then store the output in latch 1145, where it may be used in accordance with the operations of an electronic device that memory array 1105 is a part.

Memory controller 1115 may be an example of aspects of the sense component 1215 described with reference to FIG. 12.

Memory controller 1115 and/or at least some of its various sub-components may be implemented in hardware, software executed by a processor, firmware, or any combination thereof. If implemented in software executed by a processor, the functions of the memory controller 1115 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The memory controller 1115 and/or at least some of its various sub-components may be physically located at various positions, including being distributed such that portions of functions are implemented at different physical locations by one or more physical devices. In some examples, memory controller 1115 and/or at least some of its various sub-components may be a separate and distinct component in accordance with various embodiments of the present disclosure. In other examples, memory controller 1115 and/or at least some of its various sub-components may be combined with one or more other hardware components, including but not limited to an I/O component, a transceiver, a network server, another computing device, one or more other components described in the present disclosure, or a combination thereof in accordance with various embodiments of the present disclosure.

Memory controller 1115 may control one or more switching components (e.g., transistors) in order to operate the other components memory array 1105, including sense component 1135 and pulsed integrator circuits therein. In some cases, memory controller 1115 may determine a discharge time based on a duration of the at least one current pulse. In other examples, memory controller 1115 may determine a state of the memory cell based on the discharge time.

Figure 12:
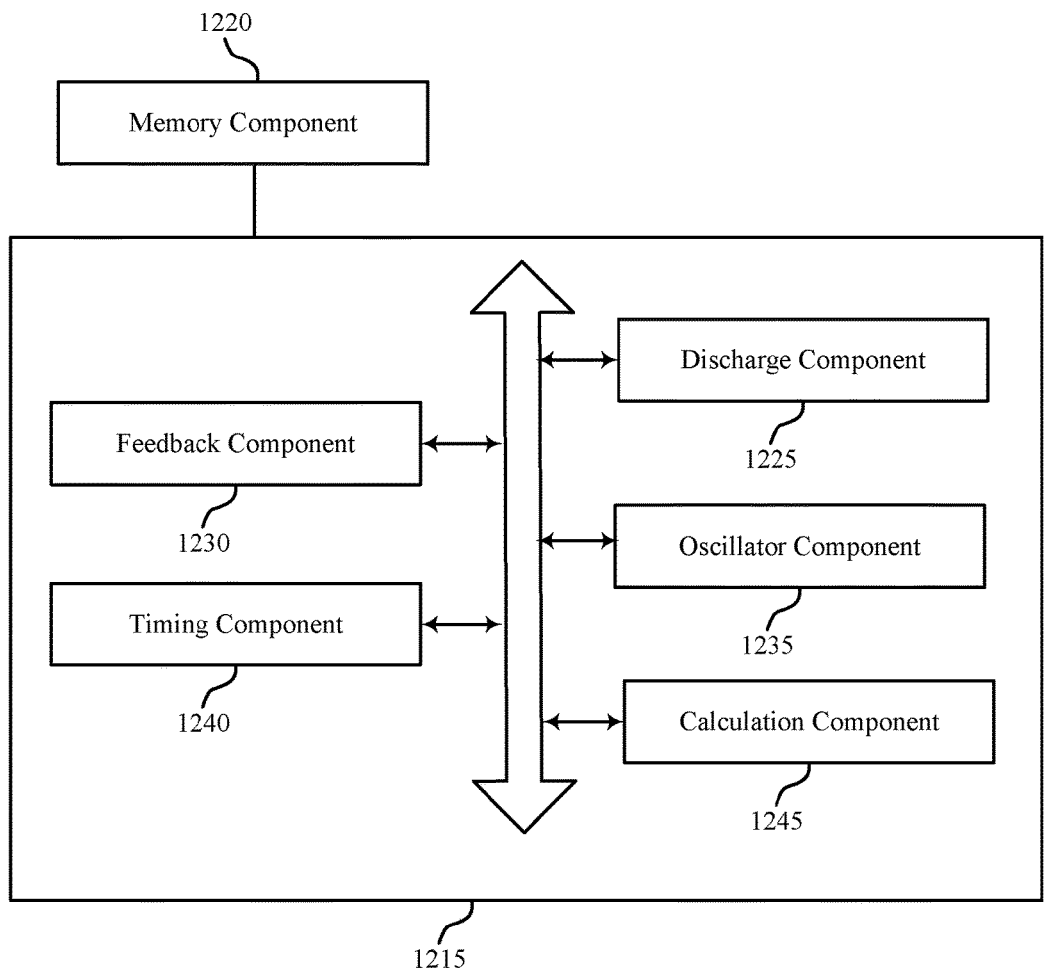
FIG. 12 illustrates a diagram of a current pulse manager that supports a pulsed integrator and memory techniques in accordance with embodiments of the present disclosure.

FIG. 12 illustrates a diagram of a block diagram 1200 of a sense component 1215 that supports a pulsed integrator and memory techniques in accordance with embodiments of the present disclosure. The sense component 1215 may be an example of aspects of a sense component 1315 described with reference to FIG. 13. The sense component 1215 may be in communication with memory component 1220. The sense component 1215 may include discharge component 1225, feedback component 1230, oscillator component 1235, timing component 1240, and calculation component 1245. Each of these modules may communicate, directly or indirectly, with one another (e.g., via one or more buses or other connections).

Memory component 1220 may comprise one or more memory cells, and each memory cell may be configured to store a plurality of logic states.

Discharge component 1225 may discharge a memory cell using at least one current pulse until a voltage associated with the memory cell reaches a reference voltage. In some cases, the at least one current pulse is a single current pulse. In some cases, the at least one current pulse is a plurality of current pulses. In some cases, each current pulse in the plurality of current pulses is of an equal duration. In some cases, the equal duration is equal to half a clock period. In some cases, each current pulse in the plurality of current pulses is separated by a same fixed interval. In some cases, the fixed interval is based on a clock frequency. In some cases, each current pulse in the plurality of current pulses is separated by a variable interval. In some cases, the variable interval is based on a signal received from a voltage feedback network, which may in some examples include an oscillator. In some cases, each current pulse in the plurality of current pulses is of an equal magnitude. In some cases, the magnitude of the at least one current pulse is constant. In some cases, discharge component 1225 comprises a current sink, which may be a current mirror.

Feedback component 1230 may be configured to compare the voltage of a memory cell to the reference voltage. In some cases, feedback component 1230 may be configured to activate discharge component 1225 based at least in part on the voltage associated with the memory cell. In other examples, feedback component 1230 may be configured to provide a unidirectional feedback path from the feedback component 1230 to memory component 1220 based at least in part on comparing the voltage of the memory cell to the reference. In some cases, feedback component 1230 or memory component 1220 may be configured to control discharge component 1225 based at least in part on the unidirectional feedback path.

Oscillator component 1235 may be configured such that each activation of the discharge component 1225 by feedback component 1230 results in a current pulse of an equal duration.

Timing component 1240 is configured to measure a discharge time as an amount of time that the discharge component 1225 is active. In some cases, the timing component 1240 is configured to measure a discharge time based on a clock frequency, which may include determining a clock count. In some cases, the timing component 1240 is configured to count a number of current pulses included in the at least one current pulse to determine a pulse count and measure the discharge time based at least in part on the pulse count. Timing component 1240 may determine a discharge time based on a duration of the at least one current pulse. In some cases, the timing component 1240 may determine the discharge time based on multiplying the pulse count by a fixed duration, the fixed duration being common to each current pulse included in the at least one current pulse. Timing component 1240 may also determine a pulse count based at least in part on a number of current pulses included in the at least one current pulse.

Calculation component 1245 may determine a state of the memory cell based on the discharge time. In some cases, calculation component 1245 may determine the state of the memory cell based at least in part on a pulse count. In some examples, calculation component 1245 may determine the amount of stored charge in the memory cell based at least in part on the pulse count, the pulse count determined at least in part by counting the number of current pulses after an input to the feedback component stabilizes at a voltage level. In some cases, calculation component 1245 may determine a state of the memory cell based at least in part on comparing a pulse count to a reference count or comparing a clock count to a reference count.

Figure 13:
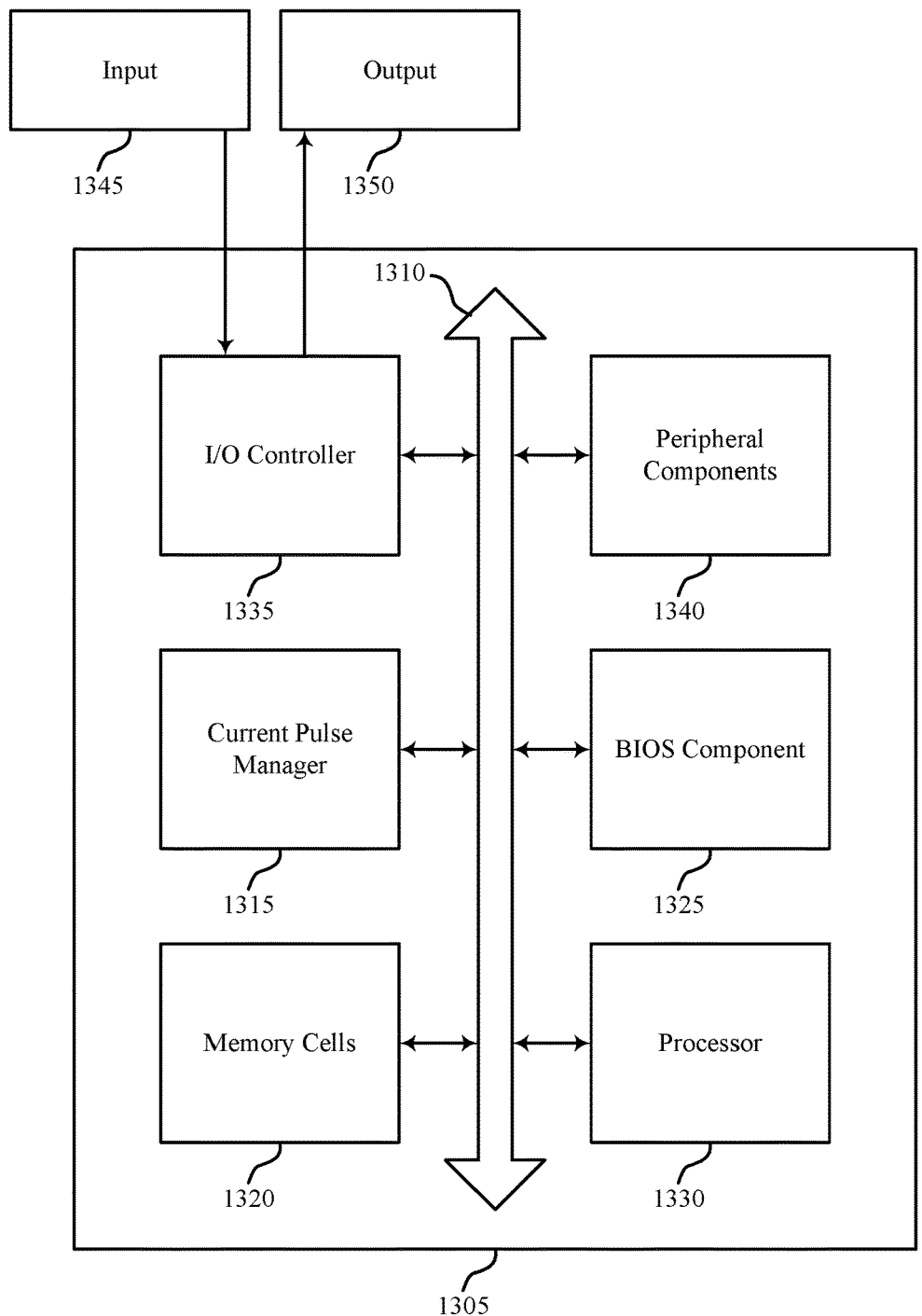
FIG. 13 illustrates a system that supports a pulsed integrator and memory techniques in accordance with embodiments of the present disclosure.

FIG. 13 illustrates a diagram of a system 1300 including a device 1305 that supports a pulsed integrator and memory techniques in accordance with embodiments of the present disclosure. Device 1305 may be an example of or include the components of current pulse manager as described above, e.g., with reference to FIG. 1. Device 1305 may include components for bi-directional voice and data communications including components for transmitting and receiving communications, including sense component 1315, memory cells 1320, basic input/output system (BIOS) component 1325, processor 1330, I/O controller 1335, and peripheral components 1340. These components may be in electronic communication via one or more buses (e.g., bus 1310) or other connections. Memory cells 1320 may store information (i.e., in the form of a logical state) as described herein.

BIOS component 1325 be a software component that includes BIOS operated as firmware, which may initialize and run various hardware components. BIOS component 1325 may also manage data flow between a processor and various other components, e.g., peripheral components, input/output control component, etc. BIOS component 1325 may include a program or software stored in read only memory (ROM), flash memory, or any other non-volatile memory.

Processor 1330 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 1330 may be configured to operate a memory array using a memory controller. In other cases, a memory controller may be integrated into processor 1330. Processor 1330 may be configured to execute computer-readable instructions stored in a memory to perform various functions (e.g., functions or tasks supporting pulsed integrator and memory techniques).

I/O controller 1335 may manage input and output signals for device 1305. I/O controller 1335 may also manage peripherals not integrated into device 1305. In some cases, I/O controller 1335 may represent a physical connection or port to an external peripheral. In some cases, I/O controller 1335 may utilize an operating system such as iOS®, ANDROID®, MS-DOS®, MS-WINDOWS®, OS/2®, UNIX®, LINUX®, or another known operating system. In other cases, I/O controller 1335 may represent or interact with a modem, a keyboard, a mouse, a touchscreen, or a similar device. In some cases, I/O controller 1335 may be implemented as part of a processor. In some cases, a user may interact with device 1305 via I/O controller 1335 or via hardware components controlled by I/O controller 1335.

Peripheral components 1340 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 1345 may represent a device or signal external to device 1305 that provides input to device 1305 or its components. This may include a user interface or an interface with or between other devices. In some cases, input 1345 may be managed by I/O controller 1335, and may interact with device 1305 via a peripheral component 1340.

Output 1350 may also represent a device or signal external to device 1305 configured to receive output from device 1305 or any of its components. Examples of output 1350 may include a display, audio speakers, a printing device, another processor or printed circuit board, etc. In some cases, output 1350 may be a peripheral element that interfaces with device 1305 via peripheral component(s) 1340. In some cases, output 1350 may be managed by I/O controller 1335

The components of device 1305 may include circuitry designed to carry out their functions. This may include various circuit elements, for example, conductive lines, transistors, capacitors, inductors, resistors, amplifiers, or other active or inactive elements, configured to carry out the functions described herein. Device 1305 may be a computer, a server, a laptop computer, a notebook computer, a tablet computer, a mobile phone, a wearable electronic device, a personal electronic device, or the like. Or device 1305 may be a portion or aspect of such a device.

Figure 14:
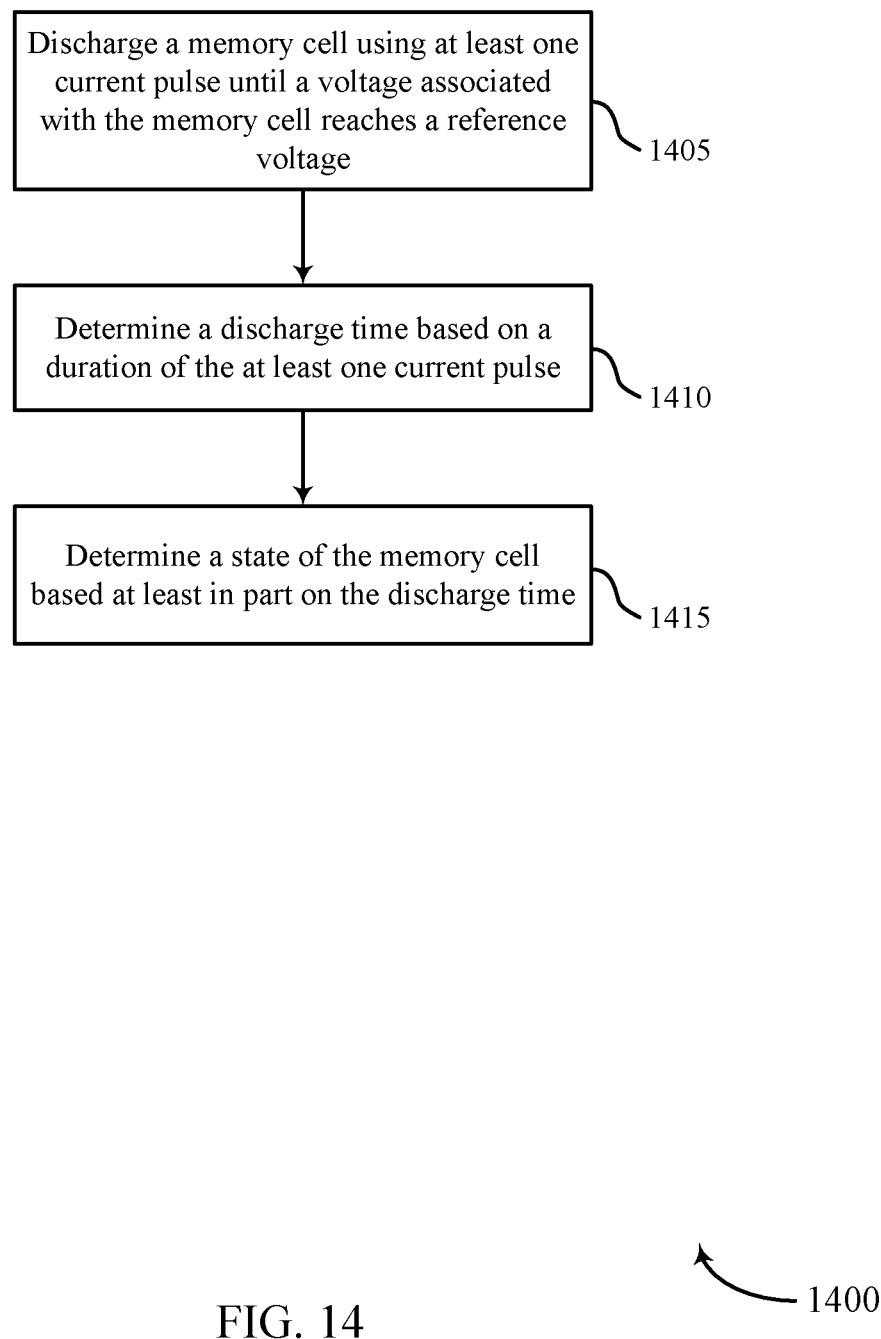
FIG. 14 is a flowchart that illustrates a method for sensing charge using a pulsed integrator and memory techniques in accordance with embodiments of the present disclosure.

FIG. 14 is a flowchart that illustrates a method 1400 for sensing charge using a pulsed integrator and memory techniques in accordance with embodiments of the present disclosure. The operations of method 1400 may be implemented by a current pulse manager or its components as described herein. For example, the operations of method 1400 may be performed by a current pulse manager as described with reference to FIGS. 11 through 13. In some examples, a current pulse manager may execute a set of codes to control the functional elements of the device to perform the functions described below. Additionally or alternatively, the current pulse manager may perform aspects of the functions described below using special-purpose hardware.

At block 1405 the current pulse manager may discharge a memory cell using at least one current pulse until a voltage associated with the memory cell reaches a reference voltage. The operations of block 1405 may be performed according to the methods described herein. In certain examples, aspects of the operations of block 1405 may be performed by a discharge component as described with reference to FIGS. 11 through 13. In some examples, the at least one current pulse is a single current pulse. In other examples, the at least one current pulse is a plurality of current pulses, where each current pulse in the plurality of current pulses is of an equal duration. For example, the equal duration may be equal to half a clock period. In other examples, each current pulse in the plurality of current pulses is separated by a same fixed interval, where the fixed interval is based at least in part on a clock frequency. In some cases, the variable interval is based on a signal received from a voltage feedback network, which may include an oscillator. In some examples, each current pulse in the plurality of current pulses is of an equal magnitude. In other examples, the magnitude of the at least one current pulse is constant.

At block 1410 the current pulse manager may determine a discharge time based at least in part on a duration of the at least one current pulse. The operations of block 1410 may be performed according to the methods described herein. In certain examples, aspects of the operations of block 1410 may be performed by a timing component as described with reference to FIGS. 11 through 13.

At block 1415 the current pulse manager may determine a state of the memory cell based on the discharge time. The operations of block 1415 may be performed according to the methods described herein. In certain examples, aspects of the operations of block 1415 may be performed by a calculation component as described with reference to FIGS. 11 through 13. In some cases, determining the state of the memory cell may be based at least in part on a pulse count.

It should be noted that the methods described above describe possible implementations, and that the operations and the steps may be rearranged or otherwise modified and that other implementations are possible. Further, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled with one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "isolated" refers to a relationship between components in which electrons are not presently capable of flowing between them; components are isolated from each other if there is an open circuit between them. For example, two components physically connected by a switch may be isolated from each other when the switch is open.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An electronic memory apparatus, comprising:
   a memory cell in electronic communication with a select line, the memory cell configured to store a plurality of logic states;
   a current sink in electronic communication with the select line, the current sink configured to discharge the memory cell using at least one current pulse until a voltage associated with the memory cell decreases to a reference voltage;
   a feedback component in electronic communication with the current sink, the feedback component configured to compare the voltage of the memory cell to the reference voltage; and
   a sense component configured to determine a state of the memory cell based at least in part on a discharge time.

2. The electronic memory apparatus of claim 1, further comprising:

a timing component, the timing component configured to measure the discharge time as an amount of time that the current sink is active.

3. The electronic memory apparatus of claim 2, wherein the timing component is configured to measure the discharge time based at least in part on a clock frequency.

4. The electronic memory apparatus of claim 2, wherein the timing component is configured to count a number of current pulses included in the at least one current pulse to determine a pulse count and measure the discharge time based at least in part on the pulse count.

5. The electronic memory apparatus of claim 1, wherein the current sink comprises a current mirror.

6. The electronic memory apparatus of claim 1, wherein the at least one current pulse is a plurality of current pulses, wherein each current pulse in the plurality of current pulses is of an equal duration.

7. The electronic memory apparatus of claim 1, wherein the feedback component is configured to activate the current sink based at least in part on the voltage associated with the memory cell.

8. The electronic memory apparatus of claim 1, wherein the feedback component is configured to provide a unidirectional feedback path from the feedback component to the current sink based at least in part on comparing the voltage of the memory cell to the reference voltage.

9. The electronic memory apparatus of claim 8, wherein the feedback component is configured to control the current sink based at least in part on the unidirectional feedback path.

10. The electronic memory apparatus of claim 1, further comprising:
an oscillator configured to activate the current sink, wherein each activation of the current sink results in a current pulse of an equal duration.

11. An electronic memory apparatus, comprising:
a memory cell in electronic communication with a select line;
a current sink in electronic communication with the select line;
a feedback component in electronic communication with the current sink;
a controller in electronic communication with the memory cell, wherein the controller is operable to:
discharge the memory cell using at least one current pulse until a voltage associated with the memory cell decreases to a reference voltage;
determine a discharge time based at least in part on a duration of the at least one current pulse; and
determine a state of the memory cell based at least in part on the discharge time.

12. The electronic memory apparatus of claim 11, wherein the controller is operable to:
determine a pulse count based at least in part on a number of current pulses included in the at least one current pulse.

13. The electronic memory apparatus of claim 12, wherein the controller is operable to:
determine the state of the memory cell based at least in part on comparing the pulse count to a reference count.

* * * * *